(12) United States Patent
Chang

(10) Patent No.: US 10,511,127 B2
(45) Date of Patent: Dec. 17, 2019

(54) HIGH-SPEED ELECTRONIC CONNECTOR

(71) Applicant: MICROSOFT TECHNOLOGY LICENSING, LLC, Redmond, WA (US)

(72) Inventor: Le Chang, Kirkland, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 0 days.

(21) Appl. No.: 15/927,056

(22) Filed: Mar. 20, 2018

(65) Prior Publication Data

US 2019/0296497 A1    Sep. 26, 2019

(51) Int. Cl.
| | | |
|---|---|---|
| *H01R 13/6584* | (2011.01) | |
| *H01R 12/72* | (2011.01) | |
| *H01R 24/60* | (2011.01) | |
| *H01R 13/6471* | (2011.01) | |

(52) U.S. Cl.
CPC ....... *H01R 13/6584* (2013.01); *H01R 12/721* (2013.01); *H01R 13/6471* (2013.01); *H01R 24/60* (2013.01); *Y10S 439/951* (2013.01)

(58) Field of Classification Search
CPC .. H01R 12/721; H01R 24/60; H01R 13/6471; Y10S 439/951
See application file for complete search history.

(56) References Cited

U.S. PATENT DOCUMENTS

| | | |
|---|---|---|
| 2,749,526 A | 6/1956 | Petersen |
| 3,264,601 A | 8/1966 | Hartholz |
| 3,553,633 A | 1/1971 | Ondrejka |
| 3,696,319 A | 10/1972 | Olsson |
| 3,703,615 A | 11/1972 | Vogt |
| 4,131,378 A | 12/1978 | Daws |
| 4,179,179 A | 12/1979 | Lowden |
| 4,241,974 A | 12/1980 | Hardesty |
| 4,421,371 A | 12/1983 | Clark et al. |
| 4,537,459 A | 8/1985 | Brennan et al. |
| 4,640,570 A | 2/1987 | Strate |
| 4,687,267 A | 8/1987 | Header et al. |

(Continued)

FOREIGN PATENT DOCUMENTS

| | | |
|---|---|---|
| CN | 103004035 A | 3/2013 |
| DE | 4331280 C1 | 9/1994 |

(Continued)

OTHER PUBLICATIONS

"Magnector N10: The Magnetic Pogo Charging Cable for Nexus 10", Retrieved From https://web.archive.org/web/20160731093531/http://magnector.com/?p=3025, Retrieved on Dec. 24, 2015, 2 Pages.

(Continued)

*Primary Examiner* — Tho D Ta
(74) *Attorney, Agent, or Firm* — NovoTechIP International PLLC

(57) ABSTRACT

Electrical connectors for connecting various computing devices include a printed circuit board with a plurality of electrical contacts, as well as a ground bar for reducing electromagnetic interference, enclosed within a housing. The counterpart female connector includes a receptacle, disposed within an outer shell and having a cavity configured to receive the connecting plug of the male connector.

17 Claims, 16 Drawing Sheets

(56) References Cited

U.S. PATENT DOCUMENTS

| | | | |
|---|---|---|---|
| 4,824,383 A | 4/1989 | Lemke | |
| 5,176,530 A | 1/1993 | Reylek et al. | |
| 5,383,790 A | 1/1995 | Kerek et al. | |
| 5,409,403 A | 4/1995 | Falossi et al. | |
| 5,510,957 A | 4/1996 | Takagi | |
| 5,552,959 A | 9/1996 | Penniman et al. | |
| RE35,508 E | 5/1997 | Lemke | |
| 5,664,953 A | 9/1997 | Reylek | |
| 5,812,356 A | 9/1998 | O'Connor | |
| 5,993,263 A | 11/1999 | Sampson | |
| 6,042,391 A | 3/2000 | Bodo et al. | |
| 6,074,225 A | 6/2000 | Wu et al. | |
| 6,109,934 A | 8/2000 | Madsen et al. | |
| 6,132,254 A | 10/2000 | Wu | |
| 6,280,209 B1 | 8/2001 | Bassler et al. | |
| 6,322,372 B1 | 11/2001 | Sato | |
| 6,565,363 B2 | 5/2003 | Downing | |
| 6,583,985 B2 | 6/2003 | Nguyen et al. | |
| 6,771,494 B2 | 8/2004 | Shimano | |
| 6,781,819 B2 | 8/2004 | Yang et al. | |
| 6,786,755 B2 | 9/2004 | Dambach et al. | |
| 6,845,005 B2 | 1/2005 | Shimano et al. | |
| 6,944,012 B2 | 9/2005 | Doczy et al. | |
| 7,094,089 B2 | 8/2006 | Andre et al. | |
| 7,331,793 B2 | 2/2008 | Hernandez et al. | |
| 7,541,907 B2 | 6/2009 | Wang et al. | |
| 7,628,628 B2 | 12/2009 | Matsuda et al. | |
| 7,758,379 B2 | 7/2010 | Chen | |
| 7,815,450 B1 | 10/2010 | Chen et al. | |
| 7,837,499 B1 | 11/2010 | Chen | |
| 7,841,776 B2 | 11/2010 | DiFonzo et al. | |
| 8,077,454 B2 | 12/2011 | Ward et al. | |
| 8,092,261 B2 | 1/2012 | Lord | |
| 8,147,277 B1 | 4/2012 | Wang et al. | |
| 8,342,857 B2 | 1/2013 | Palli et al. | |
| 8,461,465 B2 | 6/2013 | Golko et al. | |
| 8,506,332 B2 | 8/2013 | Sommers et al. | |
| 8,596,881 B2 | 12/2013 | Umeno | |
| 8,708,750 B2 | 4/2014 | Ho | |
| 8,721,356 B2 | 5/2014 | Webb et al. | |
| 8,780,541 B2 | 7/2014 | Whit et al. | |
| 8,784,123 B1 | 7/2014 | Leiba et al. | |
| 8,794,981 B1 | 8/2014 | Rodriguez et al. | |
| 8,808,029 B2 | 8/2014 | Castillo et al. | |
| 8,821,194 B2 | 9/2014 | Shih et al. | |
| 8,827,331 B2 | 9/2014 | Corcoran et al. | |
| 8,882,524 B2 | 11/2014 | Golko et al. | |
| 8,911,260 B2 | 12/2014 | Golko et al. | |
| 8,947,861 B2 | 2/2015 | Staats et al. | |
| 9,017,092 B1 | 4/2015 | McCracken et al. | |
| 9,054,477 B2 | 6/2015 | Brickner et al. | |
| 9,069,527 B2 | 6/2015 | Leong et al. | |
| 9,112,304 B2 | 8/2015 | Rohrbach et al. | |
| 9,178,316 B1 | 11/2015 | McCracken et al. | |
| 9,728,915 B2 | 8/2017 | Aldehayyat | |
| 9,843,137 B2 | 12/2017 | McCracken et al. | |
| 9,991,616 B2 * | 6/2018 | Axelowitz | H01R 12/721 |
| 2001/0053624 A1 | 12/2001 | Medina et al. | |
| 2004/0229502 A1 | 11/2004 | Hu et al. | |
| 2008/0127684 A1 | 6/2008 | Rudduck et al. | |
| 2009/0088024 A1 | 4/2009 | Ling et al. | |
| 2009/0117784 A1 | 5/2009 | Wu | |
| 2009/0318026 A1 | 12/2009 | Yi et al. | |
| 2011/0261509 A1 | 10/2011 | Xu et al. | |
| 2012/0015561 A1 | 1/2012 | Tsai | |
| 2012/0045920 A1 | 2/2012 | Wu | |
| 2012/0177324 A1 | 7/2012 | Schwandt et al. | |
| 2012/0200173 A1 | 8/2012 | Liu et al. | |
| 2012/0224316 A1 | 9/2012 | Shulenberger | |
| 2013/0021738 A1 | 1/2013 | Yang et al. | |
| 2013/0040470 A1 | 2/2013 | Gao et al. | |
| 2013/0095701 A1 | 4/2013 | Golko et al. | |
| 2013/0115814 A1 | 5/2013 | Briant et al. | |
| 2013/0171885 A1 | 7/2013 | Zhang | |
| 2013/0217260 A1 | 8/2013 | Nichols et al. | |
| 2013/0273752 A1 | 10/2013 | Rudisill et al. | |
| 2013/0332642 A1 | 12/2013 | Capezza | |
| 2014/0130316 A1 | 5/2014 | Rudduck et al. | |
| 2014/0132550 A1 | 5/2014 | McCracken et al. | |
| 2014/0254077 A1 | 9/2014 | Griffin | |
| 2014/0347802 A1 | 11/2014 | Lee | |
| 2014/0362509 A1 | 12/2014 | Lin | |
| 2015/0116926 A1 | 4/2015 | Robinson et al. | |
| 2015/0162684 A1 * | 6/2015 | Amini | H01R 12/73 439/660 |
| 2015/0214677 A1 | 7/2015 | Huang et al. | |
| 2015/0277491 A1 | 10/2015 | Browning et al. | |
| 2015/0325952 A1 | 11/2015 | McCracken et al. | |
| 2015/0325953 A1 | 11/2015 | McCracken et al. | |
| 2015/0349465 A1 * | 12/2015 | Cornelius | H01R 13/665 439/620.22 |
| 2016/0049752 A1 | 2/2016 | Qian et al. | |
| 2016/0285207 A1 | 9/2016 | Huang et al. | |
| 2016/0344146 A1 * | 11/2016 | Aldehayyat | H01R 24/58 |
| 2017/0288360 A1 | 10/2017 | Zhao et al. | |

FOREIGN PATENT DOCUMENTS

| | | |
|---|---|---|
| EP | 2169774 A1 | 3/2010 |
| JP | H04317899 A | 11/1992 |
| JP | 2007087877 A | 4/2007 |
| JP | 2010532914 A | 10/2010 |
| TW | M416231 U | 11/2011 |
| WO | 2010065569 A2 | 6/2010 |
| WO | 2011088012 A1 | 7/2011 |
| WO | 2011150403 A1 | 12/2011 |
| WO | 2011163260 A1 | 12/2011 |
| WO | 2014120966 A1 | 8/2014 |
| WO | 2014164889 A2 | 10/2014 |
| WO | 2015171441 A1 | 11/2015 |
| WO | 2016186781 A1 | 11/2016 |

OTHER PUBLICATIONS

Rosenberger, "Magnetic USB—The Magnetic USB 2.0 Cables", Retrieved From https://web.archive.org/web/20180314200234/http://www.magnetic-usb.com/, Retrieved on Jan. 5, 2016, 6 Pages.

Znaps, "Znaps—The $9 Magnetic Adaptor for your Mobile Devices", Retrieved From https://www.kickstarter.com/projects/1041610927/znaps-the-9-magnetic-adapter-for-your-mobile-devic, Retrieved on Jul. 16, 2015, 28 Pages.

"Non Final Office Action Issued in U.S. Appl. No. 14/272,361", dated Sep. 4, 2014, 19 Pages.

"Office Action Issued in Colombian Patent Application No. NC2016/0004919", dated Mar. 14, 2018, 16 Pages.

Zhou, et al., "Signal Integrity Analysis of High-Speed Signal Connector USB 3.0", In Proceedings of Advanced Materials Research, vols. 760-762, Sep. 2013, 3 Pages.

Smith, Ryan, "USB Type-C: Charging Power, Display, & Data All in One—The 2015 MacBook Review", Retrieved From http://www.anandtech.com/show/9136/the-2015-macbook-review/6, Apr. 14, 2015, 8 Pages.

"Final Office Action Issued in U.S. Appl. No. 14/312,553", dated Apr. 1, 2015, 6 Pages.

"Non Final Office Action Issued in U.S. Appl. No. 14/312,553", dated Sep. 8, 2014, 18 Pages.

Purcher, Jack, "Finally! Apple Reveals their Hybrid Notebook Tablet Details", Retrieved From http://www.patentlyapple.com/patently-apple/2013/04/finally-apple-reveals-their-hybrid-notebook-tablet-details.html, Apr. 4, 2013, 7 Pages.

"Second Written Opinion Issued in PCT Application No. PCT/US2016/028192", dated May 3, 2017, 04 Pages.

"International Search Report and Written Opinion Issued in PCT Application No. PCT/US2016/028192", dated Jun. 17, 2016, 13 Pages.

"Final Office Action Issued in U.S. Appl. No. 14/716,598", dated Jul. 8, 2016, 6 Pages.

"Non Final Office Action Issued in U.S. Appl. No. 14/716,598", dated Jan. 15, 2016, 7 Pages.

(56) References Cited

OTHER PUBLICATIONS

"Non Final Office Action Issued in U.S. Appl. No. 14/716,598", dated Dec. 23, 2016, 19 Pages.
"International Preliminary Report on Patentability Issued in PCT Application No. PCT/US2016/028192", dated Aug. 28, 2017, 7 Pages.
"Second Written Opinion Issued in PCT Application No. PCT/US2015/028681", dated May 20, 2016, 6 Pages.
"Non Final Office Action Issued in U.S. Appl. No. 14/731,813", dated Feb. 8, 2017, 21 Pages.
"International Search Report and Written Opinion Issued in PCT Application No. PCT/US2015/028681", dated Aug. 20, 2015, 11 Pages.
"Office Action Issued in European Patent Application No. 15722389.2", dated Nov. 30, 2017, 8 Pages.
"International Preliminary Report on Patentability Issued in PCT Application No. PCT/US2015/028681", dated Aug. 1, 2016, 7 Pages.
"Office Action Issued in Australian Patent Application No. 2015256407", dated Jun. 27, 2018, 3 Pages.
"First Office Action and Search Report Issued in Chinese Patent Application No. 201580023806.5", dated Jul. 2, 2018, 14 Pages.
"Office Action Issued in Colombian Patent Application No. NC2016/0004919", dated Dec. 20, 2016, 2 Pages. (W/o English Translation).
"Office Action Issued in Chile Patent Application No. 2766-2016", dated Apr. 24, 2018, 7 Pages.
Hollister, Sean, "Lenovo ThinkPad Helix Tablet/Laptop Hybrid Gets a Power-Up When it Docks", Retrieved From http://www.theverge.com/2013/1/6/3844010/lenovo-thinkpad-helix-convertible, Jan. 6, 2013, 3 Pages.
Ingle, et al., "Super Speed Data Traveller USB 3.0", In International Journal of Electronics, Communication and Soft Computing Science & Engineering, vol. 2, No. 6, Apr. 2013, 9 Pages.
Kessler, Derek, "Acer Debuts the Aspire Switch 10, a Convertible, Detachable Tablet", Retrieved From http://www.windowscentral.com/acer-debuts-aspire-switch-10-convertible-tablet, Apr. 29, 2014, 13 Pages.
"Office Action Issued in Colombia Patent Application No. NC2016/0004919", dated Dec. 12, 2016, 2 Pages (W/o English Translation).
"Second Office Action and Search Report Issued in Chinese Patent Application No. 201580023806.5", dated Dec. 29, 2018, 15 Pages.
"Office Action Issued in Chilean Patent Application No. 2766-2016", dated Sep. 20, 2018, 8 Pages.
"Third Office Action Issued in Chinese Patent Application No. 201580023806.5", dated Apr. 9, 2019, 16 Pages.
"Office Action in Japanese Patent Application No. 2016-566706", dated Feb. 26, 2019, 6 Pages.
"Notice of Allowance Issued in European Patent Application No. 15722389.2", dated Mar. 14, 2019, 2 Pages.
"International Search Report and Written Opinion Issued in PCT Application No. PCT/US19/021521", dated May 13, 2019, 11 Pages.
"Office Action Issued in European Patent Application No. 16718842.4", dated Aug. 7, 2019, 7 Pages.

\* cited by examiner

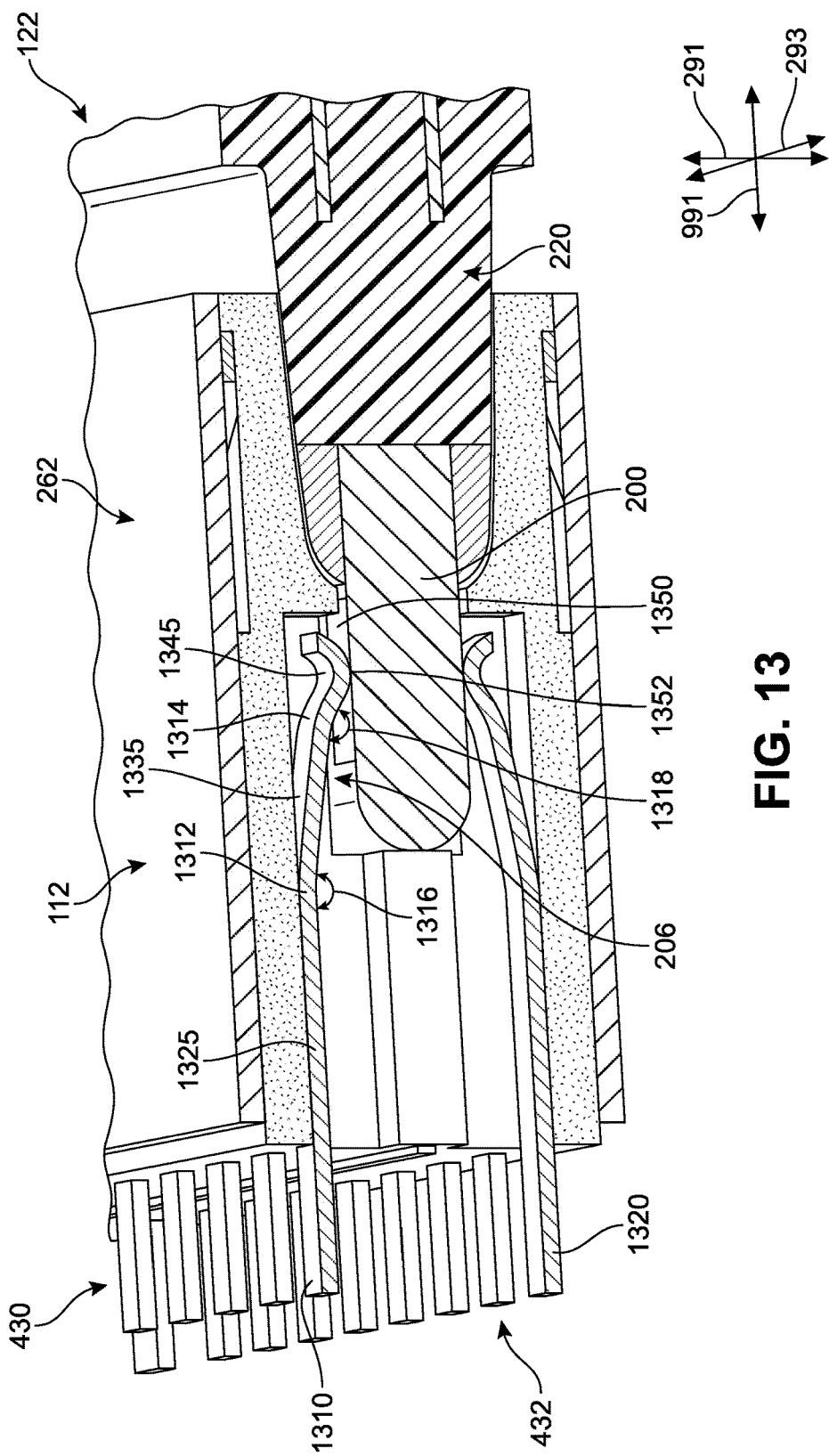

| 1 | 2 | 3 | 4 | 5 | 6 | 7 | 8 | 9 | 10 | 11 | 12 |
|---|---|---|---|---|---|---|---|---|---|---|---|
| Power | Detect 1 | GND | EMI GND | GND | TX1+ | TX1- | GND | TX3+ | TX3- | GND | D+ |
| Power | Detect 2 | GND | EMI GND | GND | RX1+ | RX1- | GND | RX3+ | RX3- | GND | D- |
| 48 | 47 | 46 | 45 | 44 | 43 | 42 | 41 | 40 | 39 | 38 | 37 |

| 13 | 14 | 15 | 16 | 17 | 18 | 19 | 20 | 21 | 22 | 23 | 24 |
|---|---|---|---|---|---|---|---|---|---|---|---|
| D- | GND | RX4- | RX4+ | GND | RX2- | RX2+ | GND | EMI GND | GND | Detect 3 | Power |
| D+ | GND | TX4- | TX4+ | GND | TX2- | TX2+ | GND | EMI GND | GND | Detect 4 | Power |
| 36 | 35 | 34 | 33 | 32 | 31 | 30 | 29 | 28 | 27 | 26 | 25 |

FIG. 15

HIGH-SPEED ELECTRONIC CONNECTOR

BACKGROUND

Electronic devices such as computing devices typically include provisions for communicating signals, exchanging electrical power, and/or providing a ground reference, with external devices. These provisions often include hardware interfaces in the form of electronic connectors. Such electronic connectors may include one or more electrical contacts that are each configured to physically contact and establish an electrical connection with a corresponding electrical contact of a paired electronic connector.

Current connectors are associated with limitations in high speed data transfer rates, and can provide insufficient electromagnetic interference (EMI) shielding. Thus, electronic connectors that are configured to communicate at higher speeds and offering improved EMI shielding are needed as electronic products are developed that are capable of transmitting larger data streams at faster rates.

SUMMARY

An electronic connector, in accord with a first aspect of this disclosure, has a first connection face on a first side of the electronic connector and a second connection face on a second side of the electronic connector. The first side and the second side are opposite-facing sides. The electronic connector also includes a housing, a printed circuit board enclosed at least partially within the housing, a first group of electrical contacts arranged on the first connection face of a nose portion of the printed circuit board, the nose portion being an exposed region disposed outside of the housing, and a first ground bar disposed on the first connection face of the printed circuit board, the first ground bar at least partially bordering the nose portion.

An electronic connector, in accord with a second aspect, includes an outer shell, where the outer shell is configured to provide a ground pathway to the electronic connector, and a receptacle disposed at least in part within the outer shell, where the receptacle includes an interior cavity. The electronic connector further includes a first connection face on a first side of the interior cavity and a second connection face on a second side of the interior cavity, the first side and the second side being opposite-facing sides. There is a first group of electrical contacts arranged on the first connection face, a ground plate disposed at least in part within the receptacle, and a first electromagnetic interference (EMI) plate in contact with both the outer shell and the receptacle, the first EMI plate including at least a first prong, the first prong protruding into the interior cavity from an aperture in the first connection face.

In accord with another aspect of this disclosure, a connecting plug for use with an electronic connector includes a printed circuit board, and a first group of electrical contacts arranged on a first surface of the printed circuit board. In addition, there is a first ground bar disposed on the first surface of the printed circuit board, the first ground bar at least partially bordering the first group of electrical contacts in an approximate U-shape.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Furthermore, the claimed subject matter is not limited to implementations that solve any or all disadvantages noted in any part of this disclosure.

BRIEF DESCRIPTION OF THE DRAWINGS

The drawing figures depict one or more implementations in accord with the present teachings, by way of example only, not by way of limitation. In the figures, like reference numerals refer to the same or similar elements. Furthermore, it should be understood that the drawings are not necessarily to scale.

FIG. 13 is an isometric cutaway view of an implementation of the mated pair of electronic connectors illustrating a path of data pins;

FIG. 15 is an implementation of a pin-out configuration for an electronic connector.

DETAILED DESCRIPTION

In the following detailed description, numerous specific details are set forth by way of examples in order to provide a thorough understanding of the relevant teachings. However, it should be apparent that the present teachings may be practiced without such details. In other instances, well known methods, procedures, components, and/or circuitry have been described at a relatively high-level, without detail, in order to avoid unnecessarily obscuring aspects of the present teachings. In the following material, indications of direction, such as "top" or "left," are merely to provide a frame of reference during the following discussion, and are not intended to indicate a required, desired, or intended orientation of the described articles.

Computing devices such as tablet computers, keyboards, and other smart devices have been increasingly moving toward a hybrid arrangement, permitting users to use similar optional detachable keyboard accessories with a touchscreen tablet. However, this trend is associated with challenges, as these hybrids can be increasingly subject to electromagnetic interference from a variety of sources. As noted above, there is a need for electronic connectors capable of providing greater data transfer speeds between two computing devices. Previous connectors have relied on soldered cables, which are associated with a highly labor-intensive manufacturing process. In addition, such connectors require a large number of data pins due to less effective mechanisms capable only of relatively low data speeds. Electromagnetic radiation associated with these connectors can also interfere with other signals such as wifi.

Figure 1:
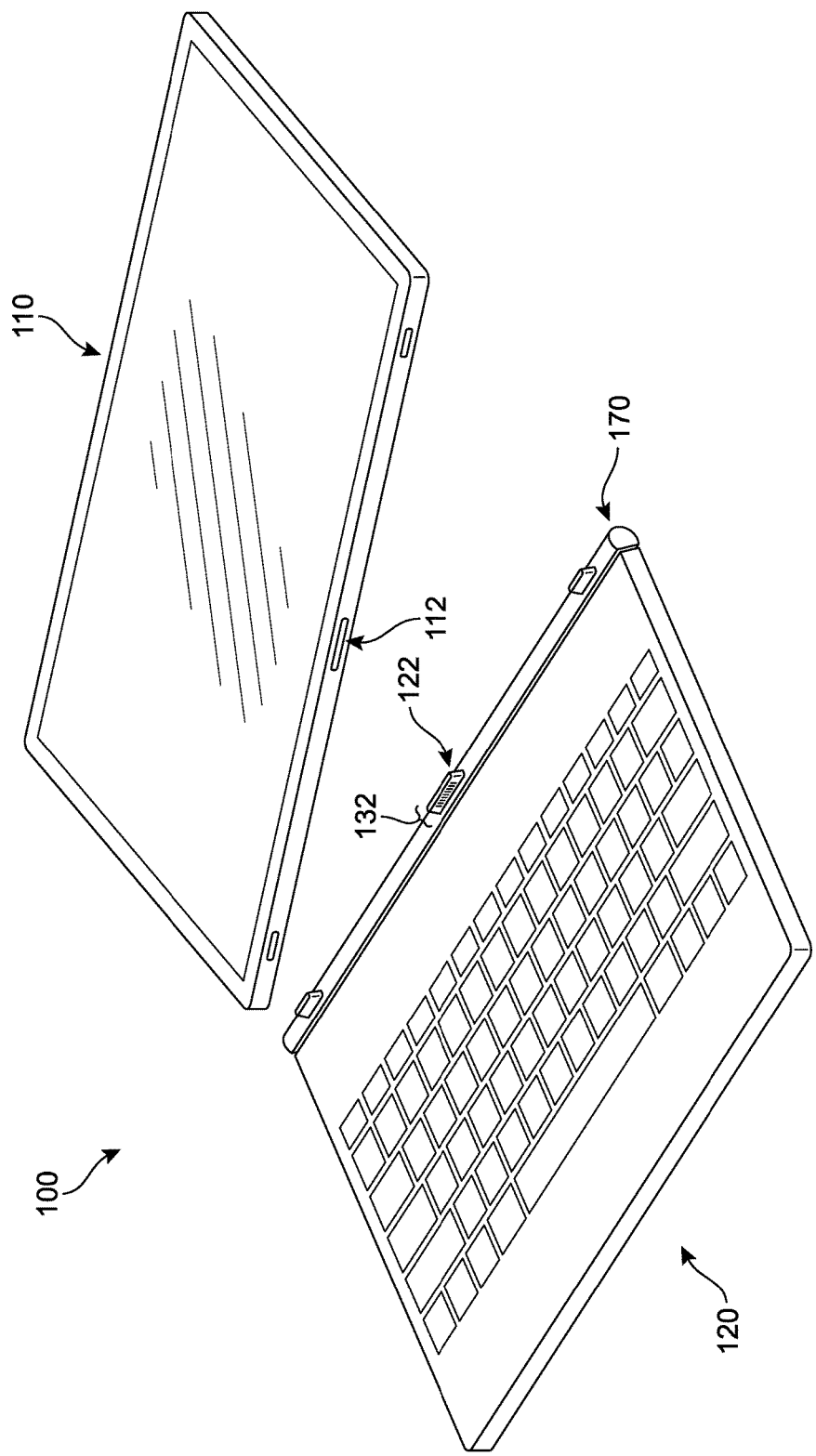
FIG. 1 illustrates an example of a computing system that includes an implementation of a pair of electronic connectors.

The following description presents electronic connector systems for use with computing devices capable of higher data transfer speed and greater signal interference protection in a smaller structure. FIG. 1 depicts one implementation of a computing system 100 that includes a pair of electronic connectors. The computing system 100 includes a first electronic device 110 and a second electronic device 120. In this example, the first electronic device 110 includes a tablet and the second electronic device 120 includes a keyboard. The first electronic device 110 also includes a female electronic connector ("female connector") 112. The female connector 112 can be configured to receive a connecting plug 132 of a corresponding male electronic connector. In addition, the second electronic device 120 includes a male electronic connector ("male connector") 122. In this case, the male connector 122 is configured to correspond to the receptacle provided in the female connector 112. In other words, the receptacle and the connecting plug 132 may each be sized and dimensioned to permit the connecting plug to be snugly and/or securely received by the receptacle. For purposes of this disclosure, the term "connecting plug" refers to the portion of the male connector that is configured for insertion within a receptacle of a corresponding female connector. In other implementations, the arrangement may be reversed, such that the first electronic device 110 includes the male connector 122 while the second device 120 includes the female connector 112.

Thus, in different implementations, the first electronic device 110 and the second electronic device 120 may be physically and electrically connected to each other via insertion or placement of the connecting plug 132 of the male connector 122 into a corresponding receptacle of the female connector 112 to form what will be referred to as a mated configuration. In the mated configuration, the first electronic device 110 and second electronic device 120 are configured to operatively interface with each other via a plurality of electrical connections established between the female connector 112 and male connector 122. In some implementations, the first electronic device 110 and second electronic device 120 may exchange electrical power, a ground reference, and/or communication signals via electrical contacts of the female connector 112 and the male connector 122. Furthermore, in a mated configuration, the female connector 112 and the male connector 122 may help provide structural support between the first electronic device 110 and second electronic device 130. For example, in a mated configuration, the first electronic device 110 may be at least partially supported by the second electronic device 120 in a vertical or angled orientation relative to a surface upon which second electronic device is supported.

In different implementations, the first electronic device 110 and the second electronic device 120 may be physically separated—thereby electrically disconnecting the two devices—by removal of the connecting plug 132 of the male connector 122 from the corresponding receptacle of the female connector 112. Thus, in a first mode of operation, one or both of the first electronic device 110 and the second electronic device 120 may be used individually in a physically separated and electrically disconnected configuration. In addition, in a second mode of operation, the first electronic device 110 and second electronic device 120 may be used in combination with each other in a mated configuration to provide enhanced functionality.

In some implementations, the female connector 112 and/or the male connector 122 may include one or more magnetically attractable elements that assist in holding female and male electronic connectors in the mated configuration. For example, such magnetically attractable elements may include a permanent magnet, an electromagnet, or a material element that is attractable by a magnet (for example, a magnetically attractable metal-based material), or other such magnetic elements. Additional details regarding magnetically attractable elements and their inclusion in the connector can be found in Aldehayyat et al., U.S. Pat. No. 9,728,915, issued on Aug. 8, 2017, and titled "Tapered-Fang Electronic Connector", and McCracken et al., U.S. Pat. No. 9,017,092, issued Apr. 28, 2015, and titled "Electronic Connector", which are both incorporated by reference herein in their entirety.

Throughout this disclosure, reference is also made to directions or axes that are relative to the connector itself, rather than to its intended orientation with regards to an electronic device. For example, the term "distal" refers to a part that is located further from a center of a connector or a particular component, while the term "proximal" refers to a part that is located closer to the center of the connector or a particular component. As used herein, the "center of the connector" could be the center of mass and/or a central plane and/or another centrally located reference surface.

In different implementations, the first electronic device 110 may include a variety of components, including one or more of a logic machine (for example, one or more processors), an information storage machine (for example, one or more memory devices), an energy storage subsystem (for example, one or more batteries), a communications subsystem (for example, one or more wireless and/or wired communication devices to communicate with other electronic devices), an input/output subsystem (for example, one or more user input and/or output devices), and/or other components. As one example, the first electronic device 110 includes a touch-sensitive graphical display that forms part of input/output subsystem.

In addition, in some implementations, the first electronic device 110 may include one or more additional electronic connectors. Each electronic connector may include one or more receptacles having a similar form and/or electrical contact arrangement as female connector 112. Alternatively or additionally, the second electronic device 120 may include one or more additional connecting plugs with a similar form and/or electrical contact arrangement as the connecting plug shown in FIG. 1.

In some implementations, an electronic connector can include a pass-through electronic connector that includes a plurality of electrical contacts, at least some or all of which are electrically connected to at least some or all of the electrical contacts of the female connector 112. A pass-through electronic connector enables the first electronic device 110 and/or the second electronic device 120 to interface with additional electronic devices or external power sources even if the female connector 112 and the male connector 122 are in a mated configuration.

In addition, in different implementations, the second electronic device 120 may also include a variety of components, including one or more of a logic machine, an information storage machine, an energy storage subsystem, a communications subsystem, an input/output subsystem, and/or other components. As one example, the second electronic device 120 includes a keyboard that forms part of an input/output subsystem. User input received via the keyboard may be processed on-board second electronic device 120 and/or may be provided to the first electronic device 110 for further processing via the male connector 122 and female connector 112 in the mated configuration. In one implementation, a logic machine of the second electronic device 120 may take the form of a graphics processing unit that cooperates with the logic machine of the first electronic device 110 to provide enhanced operation capacity of computing system 100 as compared to operation of the first electronic device 110 individually. In this example, the logic machine of the first electronic device 110 may offload some processing tasks to a logic machine of the second electronic device 120.

In addition, in different implementations, the second electronic device 120 may further include one or more additional electronic connectors. As one example, the second electronic device 120 may include one or more additional electronic connectors located along an exterior of a device body of the second electronic device 120. The electronic connector may include one or more connecting plugs having a similar form and/or electrical contact arrangement as the connecting plug of the male connector 122. In some implementations, the electronic connector takes the form of a pass-through electronic connector that includes a plurality of electrical contacts, at least some or all of which are electrically connected to at least some or all of the electrical contacts of the male connector 122. As previously described, a pass-through electronic connector enables the second electronic device 120 and/or first electronic device 110 to interface with additional electronic devices or external power sources even if the female connector 112 and male connector 122 are in the mated configuration.

In different implementations, the computing system 100 may further include a sequential multi-pivot hinge assembly 170. As one example, the hinge assembly 170 is incorporated into the second electronic device 120. In other examples, the hinge assembly 170 may form part of the first electronic device 110. The hinge assembly 170 is configured to enable two electronic devices that are in a mated configuration via female and male electronic connector(s) to rotate relative to each other about one or more pivot axes. As an example, the first electronic device 110 may be folded relative to second electronic device 120 between an opened and closed configuration that simulates a notebook or a laptop computer. In the example of FIG. 1, the hinge assembly 170 includes five parallel pivot axes arranged in sequential order. However, a sequential multi-pivot hinge assembly may include a greater or lesser number of parallel pivot axes. As depicted in FIG. 1, the male connector 122 is located along a portion of the hinge assembly 170. In other examples, a female electronic connector, such as the female connector 112, may be located on a portion of the hinge assembly 170. In still further examples, the hinge assembly 170 may be omitted.

Figure 2:
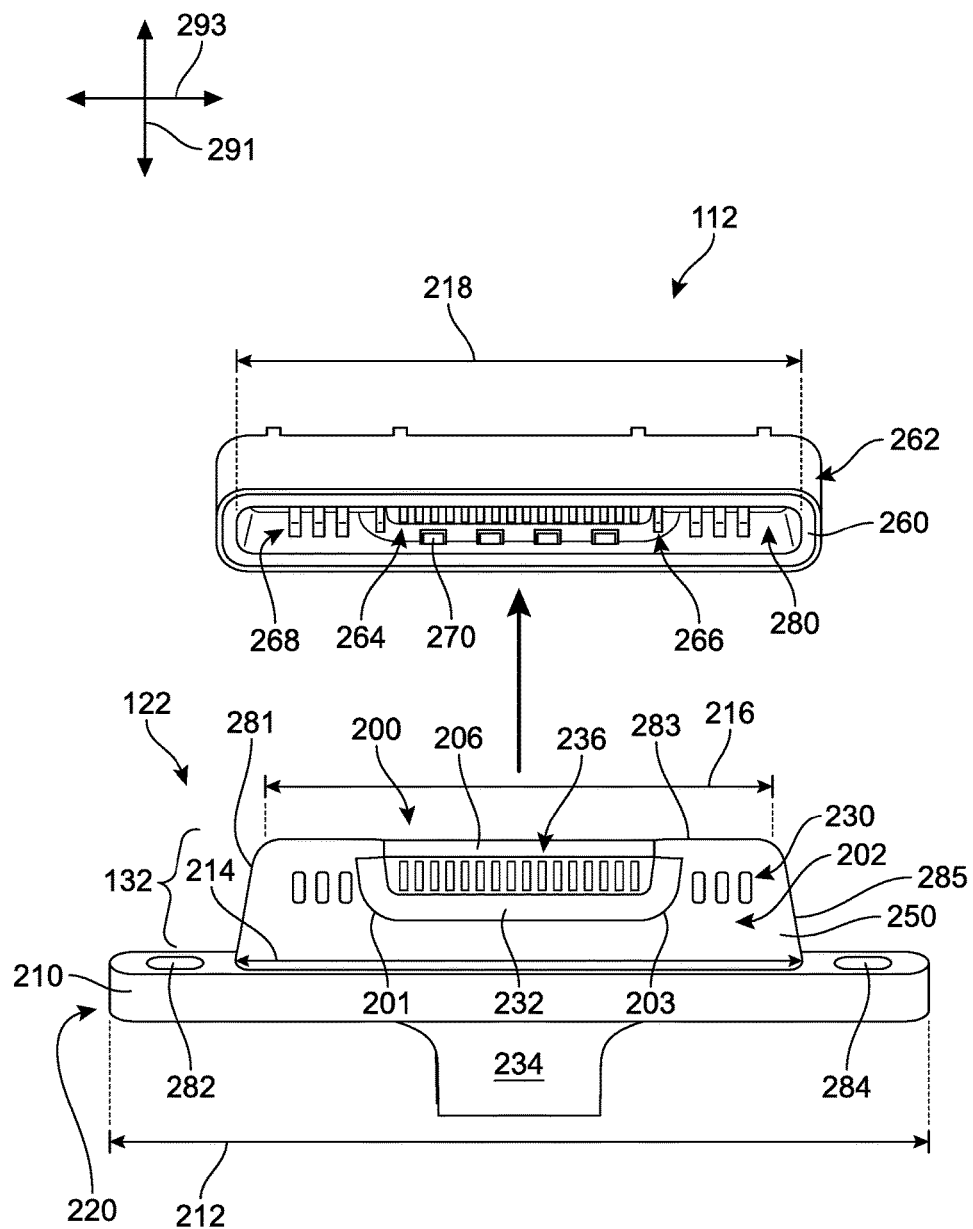
FIG. 2 is an isometric view of an implementation of a male electronic connector disconnected from a corresponding female electronic connector.
Figure 3:
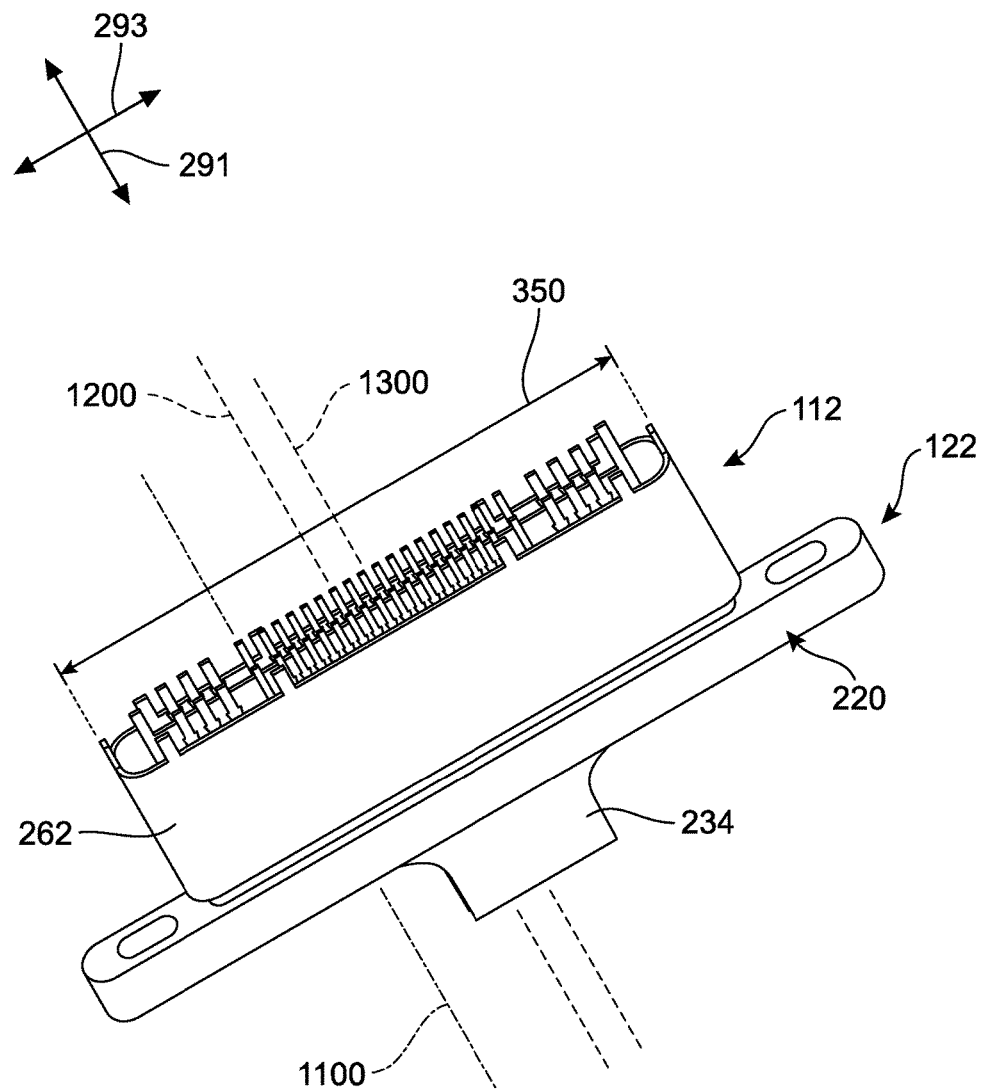
FIG. 3 is an isometric view of an implementation of the male electronic connector mated with the corresponding female electronic connector.

As discussed above, in different implementations, two or more electronic devices may be physically separated and thereby electrically disconnected by removal of the connecting plug of the male connector 122 from the corresponding receptacle of the female connector 112. An implementation of the first mode of operation, in which the male connector 122 is separated from the female connector 112, is illustrated in FIG. 2. In addition, an implementation of the second mode of operation, in which the male connector 122 is mated to the female connector 112, is illustrated in FIG. 3.

Referring first to the disconnected or separated state shown in FIG. 2, in one implementation, the male connector 122 includes a circuit board ("board") 200 disposed partially in a housing 220. In some implementations, the housing 220 may extend distally outward from and/or form part of a device body of an electronic device, as illustrated in FIG. 1. For purposes of reference, the housing 220 can be understood to include a base 210 and an upper portion 250, where the upper portion 250 is joined to the base 210 and extends distally away from the base 210. In some implementations, the length of the base 210 can differ from the length of the upper portion. For example, in FIG. 2, the base 210 has a first length 212 and the upper portion 250 has a second length 214 along its lower edge, where the first length 212 is greater than the second length 214. In other implementations, the base 210 and the upper portion 250 can include substantially similar lengths. In some implementations, the base 210 can include provisions for facilitating the attachment or connection of the male connector to an electronic device. For example, in FIG. 2, the base includes a first aperture 282 and a second aperture 284. Each aperture can be used to couple or anchor the male connector to a surface associated with the electronic device via a screw, bolt, pin, or other insertable connector or adhesive.

In some implementations, the upper portion 250 of the housing 220 can include a substantially tapered, rectangular, or trapezoidal cross-sectional shape. For example, in FIG. 2, the forward-facing periphery of the upper portion 250 has a third length 216, where the third length 216 is less than the second length 214 associated with the lower periphery of the upper portion 250 adjacent to the base portion. Additional information regarding the housing 220 will be provided with respect to FIG. 11.

It should be understood that in some implementations, the male connector 122 may be symmetrical about a vertical axis 291 and/or a horizontal axis 293. In FIG. 2, the male connector 122 includes a first connection face ("first face") 202 on a first side of the connector and a second connection face ("second face") that is associated with a second opposite-facing side relative to the first side. For purposes of this disclosure, opposite facing sides or surfaces include parallel planes as well as those surfaces that do not lie in the same plane when they generally face in opposing directions. For example, in some implementations, the first face and the second face can be angled or inclined with respect to one another (see, for example, the cross-sectional view of FIG. 11), and are referred to as opposite facing. Thus, in this case, opposite facing sides can refer to the general arrangement of two surfaces that are facing away from one another. In FIG. 2, the first face 202 is the side facing toward the viewer, and the second face may be understood to comprise the opposite facing surface.

The first connection face and the second connection face of the male connector can be joined to one another by a forward facing three-sided surface that is approximately perpendicular to the orientation of the connection faces. The three-sided surface corresponds to the thickness of the connector at its forward periphery, and includes a first edge 281, a second edge 283, and a third edge 285.

In some implementations, the male connector 122 can include structures physically arranged in mirror-image relationships to one another. Along the first face 202, the male connector 122 further includes a plurality of power bars 230, at least a first ground bar 232, a flexible connector 234, and a plurality of data bars 236. In one implementation, one or more components of the first face 202 may also be provided along the second face, to the extent that the first face 202 and the second face are substantially identical. For purposes of the implementations shown in the Figures, it will be understood that both the first face and the opposite-facing second face are substantially similar in structure and components. In other words, a first set of data bars is disposed along the first face 202 of the board 200, and a second set of data bars (not shown in FIG. 2) is also disposed along the opposite side of the board 200. However, in other implementations, the two sides may differ in structure, geometry, and/or types and/or placement of components. In implementations where the two sides differ, the connectors will be configured to mate or connect along a single orientation.

Furthermore, in some implementations, the female connector 112 of FIG. 2 can include a receptacle 260, an outer shell ("shell") 262, a plurality of data springs 264, a plurality of electromagnetic (EMI) springs 266, a plurality of power springs 268, and at least a first EMI plate 270. As shown in FIG. 2, the upper portion 250 of the male connector 122 can be sized and dimensioned to be snugly received by an interior cavity 280 formed within the receptacle 260. For example, the second length 214 corresponding to the longest end of the upper portion 250 is substantially similar to a fourth length 218 corresponding to a maximum length of the interior cavity 280 in the receptacle 260. In some implementations, the dimensions of the interior cavity can be arranged to provide a tapered shape that corresponds to the geometry of the tapered upper portion. Additional details regarding the dimensions of the two connectors will be provided with respect to FIG. 11.

In the implementation of FIG. 2, the male connector 122 includes a single connecting plug 132 protruding from the base 210. However, in other implementations, there may be multiple connecting plugs protruding or extending upward from the base 210. For example, there may be a first and second plug spaced apart from one another by a distance as measured along the X-coordinate axis, providing multiple connecting plugs. When multiple connecting plugs are present, they may be aligned horizontally, vertically, or with other symmetrical alignments. Symmetric configurations may enable the male connector 122 to mate with a female connector in two reversible orientations. In other implementations, non-symmetrical alignments and/or spacings may be used.

Referring to the connecting plug 132 of FIG. 2, an exposed portion of the board 200 can be seen extending between a first inner flank portion ("first inner flank") 201 of the housing 220 and a second inner flank portion ("second inner flank") 203 of the housing 220. This exposed portion of the board 200 will be referred to as a nose portion ("nose") 206 of the board 200. The nose 206 can be configured as a terminal end of the male connector 122. Together, the nose 206 and the upper portion 250 form the connecting plug 132 that is configured for snug, secure insertion into the interior cavity 280 of the receptacle 260. Furthermore, the nose 206 of the board 200 can include the data bars 236, which provide the plug with a number of high speed contacts. The number of data bars 236 can vary in different implementations. In FIG. 2, there are 16 data bars arranged in a substantially parallel orientation relative to one another on the first face 202 as well as 16 data bars (not shown in FIG. 2) arranged in a similar orientation on the second face. In other implementations, there may be fewer than 16 data bars or greater than 16 data bars, thereby accommodating the various requirements of different computing systems and devices. As will be discussed further below, one or more of the data bars can be configured to contact a data spring of the data springs 264 provided within the receptacle 260.

In different implementations, the nose 206 can be configured to provide an electrical contact region between the data bars 236 of the male connector 122 and the data springs 264 of the female connector 112. Such contact can function as a pathway for communication (transmission and/or receipt) of data between two electronic devices. In some implementations, the nose 206 may define corresponding openings or windows occupied by data bars. Externally facing connection surfaces of the data bars may be flush with the outer surface or face of the nose, may protrude relative to the surface of the nose, or may be recessed relative to the surface of the nose.

In addition, the flexible connector 234 can be configured to transmit or receive data to/from the electronic device connected to the male connector to/from the data bars 236. Thus, referring back to the structure of the female connector 112, it can be understood that the receptacle 260 forms a female-side of an electronic connector pair with the connecting plug of the corresponding male connector. Each data spring of the plurality of data springs 264 includes an electrical contact that is configured to physically contact and establish an electrical connection with respective electrical contacts of the data bars 236. As one example, electrical contacts of a first set of data bars on the first face can physically contact and establish an electrical connection with a first set of data springs in the receptacle of the male connector 122 in the mated configuration. In this case, the first set of data bars includes 16 electrical contacts that are aligned with the 16 electrical contacts of the first set of data springs. In a reversible configuration, electrical contacts of the first set of data bars physically contact and establish an electrical connection with an opposing set of data springs in the receptacle. The components disposed within the receptacle of the female connector will be discussed in further detail with respect to FIG. 8.

Figure 6A:
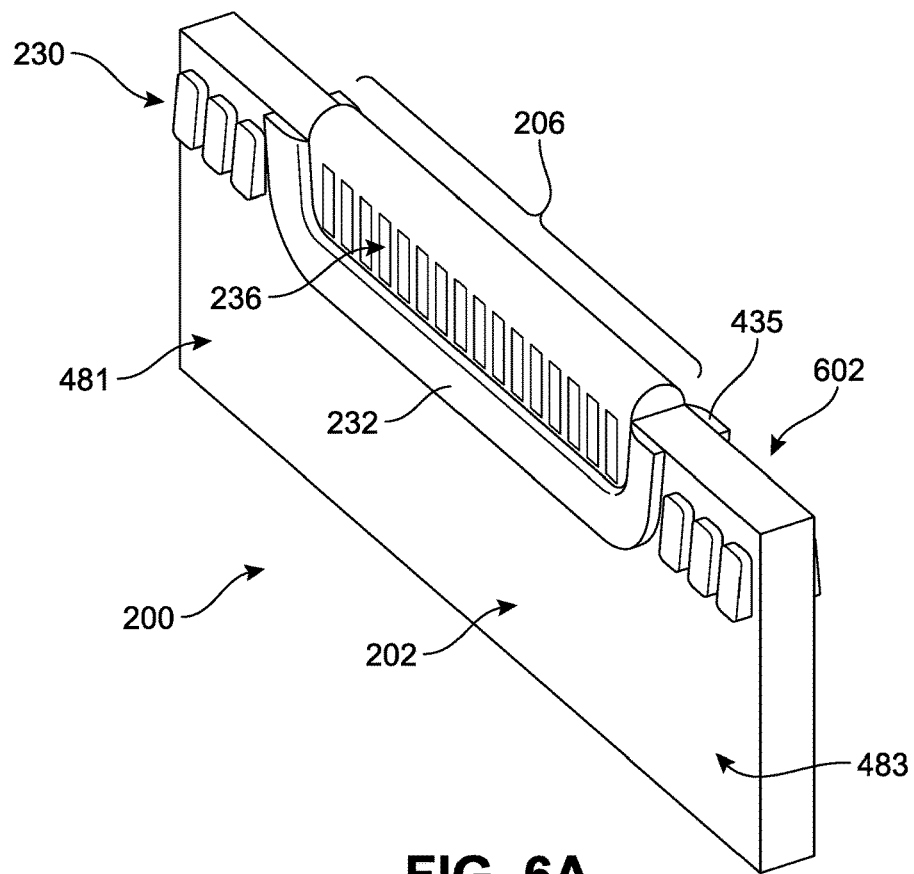
FIG. 6A is an isolated view of an implementation of a circuit board and FIGS. 6B-6E are isolated isometric view of a pair of ground bars.

In different implementations, the features, characteristics, properties, and/or components associated with any electronic connectors described herein can be used in a variety of device types and configurations. For example, in one implementation, the male connector may be associated with a plug or cord independent of an electronic device, while the receptacle of the corresponding female connector is formed in a portion of an electronic device. In other implementations, the female connector may be associated with a cord or plug independent of an electronic device, while the male connector extends from an electronic device. As another example, the electronic connector described herein may not include the housing 220, or the housing may have a structure that differs from that illustrated. For example, in some cases, the housing may not include a base 210. Similarly, some implementations of the male connector or female connector may not include a flexible connector. One implementation of a male connector without a housing or flexible connector is illustrated in FIG. 6A.

Thus, in some implementations, a male connector or a female connector may be in communication or connected with a device or data stream or transfer through other means, such as Z-axis connectors, insertion connectors, sculptured (unsupported) connectors, copper traces, board to board connectors (for example, PCB to PCB), selective plating and etching of a terminal finger, zero insertion force connectors, ring and spade connectors, mechanical crimping connectors, solder attached connectors, such as circular connectors, D Subminiature connectors, and pin and socket connectors. Thus, the PCB and data bars on the PCB may be implemented in a wide variety of electronic connections, including any device including digital circuits. One or more structures comprising the male connector and/or female connector described herein may be utilized with microprocessors, microcontrollers, application-specific integrated circuits (ASICs), digital signal processors (DSPs), field-programmable gate arrays, and any other type of computing device, among other electronic devices.

The male connector 122 and the female connector 112 of FIG. 2 are illustrated in the second mode, or mated configuration, in FIG. 3. It can be understood that the outer shell 262 has a fifth length 350 that is slightly greater than the second length 214 (identified in FIG. 2). The outer shell 262 can have a substantially rectangular cross-sectional shape in some implementations. However, in other implementations, the shape of the outer shell can vary to correspond to the space and design requirements of the various electronic devices and connector types. In different implementations, the outer shell 262 can be made at least partially of a metal material, while the receptacle disposed within the shell 262 can be made at least partially of plastic materials. For purposes of clarity, the connector set of FIG. 3 is presented in an exploded view in FIG. 4.

Figure 4:
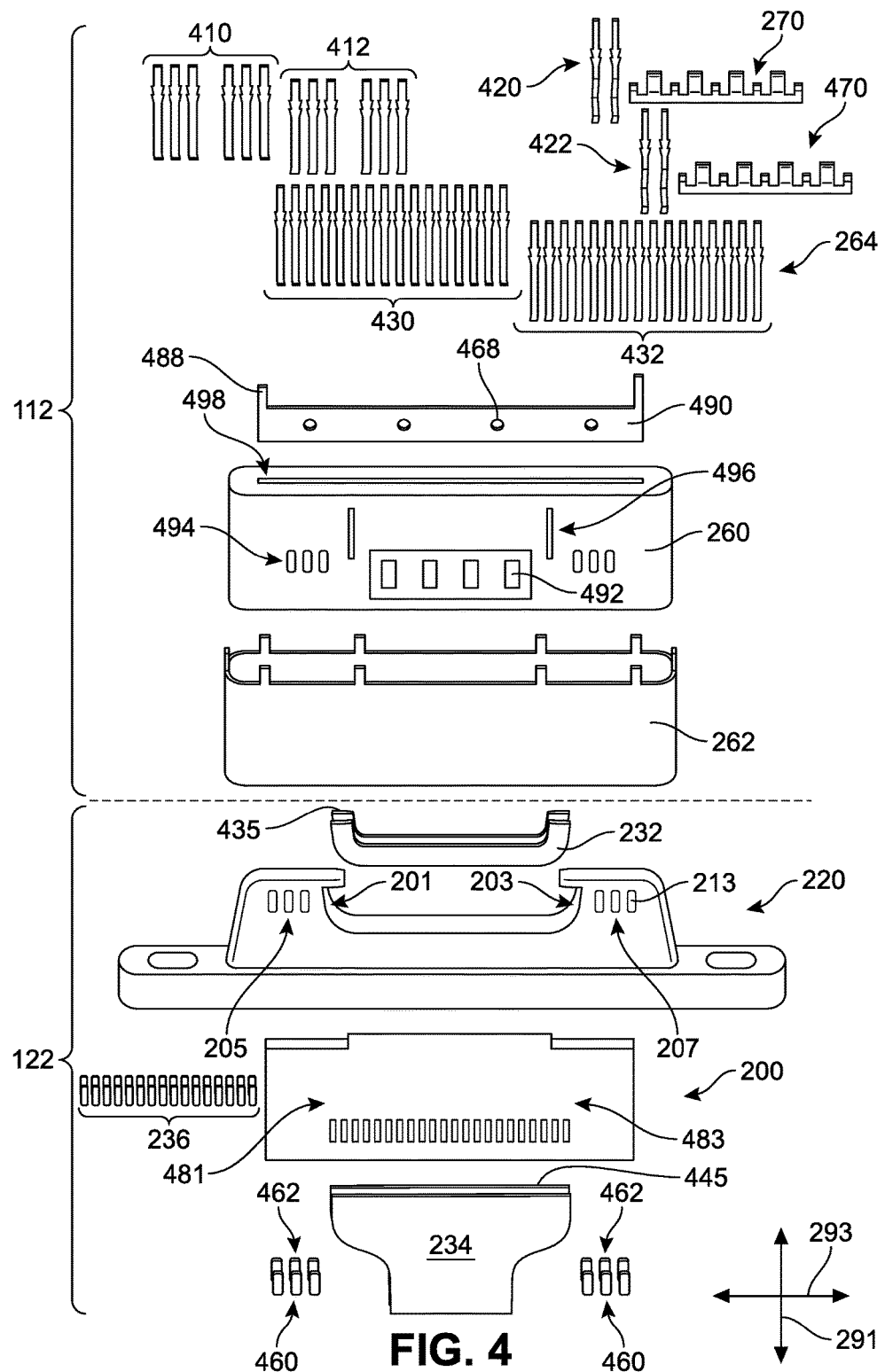
FIG. 4 is an exploded isometric view of an implementation of the pair of electronic connectors.

In FIG. 4, the various components comprising the pair of connectors are illustrated separated from one another. It should be understood that in different implementations, the connectors can include additional components, or some of these components may be omitted. Furthermore, depending on the configuration or design of the electronic device(s) for which the connectors are used, the components may vary in size, dimensions, shape, and/or number.

The components of the female connector 112 are depicted toward the top side of the figure, and the components of the male connector 122 are depicted toward the bottom side of the figure. As identified earlier, the female connector 112 includes the receptacle 260, EMI springs 266, power springs 268, data springs 264, and the first EMI plate 270. In this view, it can be seen that the power springs 268 include a first set of power springs 410 (associated with an upper side of the interior of the receptacle) and a second set of power springs 412 (associated with a lower side of the interior of the receptacle). Furthermore, in this example, there are six power springs in the first set and six power springs in the second set, though in other implementations, there may be a fewer or greater number of power springs, and/or the number and arrangement of power springs in each set can differ from one another. The power spring(s) can be disposed or partially inserted into openings 494 formed in the surface of the receptacle 260. In FIG. 4 these openings 494 are formed on an upper outer surface of the receptacle 260. It should be understood that features described with respect to the upper surfaces can also be included on the lower surfaces in implementations where the connector is symmetrical.

Furthermore, the EMI springs 266 includes a first EMI spring set 420 (associated with an upper side of the interior of the receptacle) and a second EMI spring set 422 (associated with a lower side of the interior of the receptacle). In this example, there are two EMI springs in the first set and two EMI springs in the second set, though in other implementations, there may be a fewer or greater number of EMI springs, and/or the number and arrangement of EMI springs in each set can differ from one another. The EMI spring(s) can be disposed or partially inserted into slits 496 formed in the surface of the receptacle 260. In FIG. 4 these slits 496 are formed on an upper outer surface of the receptacle 260.

In addition, the data springs 236 include a first set of data springs 430 (associated with an upper surface of the interior of the receptacle) and a second set of data springs 432 (associated with a lower surface of the interior of the receptacle). In this example, there are sixteen data springs in the first set and sixteen data springs in the second set, though in other implementations, there may be a fewer or greater number of data springs, and/or the number and arrangement of data springs in each set can differ from one another.

Furthermore, a second EMI plate 470 is also included, associated with the lower side of the interior of the receptacle. The EMI plate(s) can be disposed or partially inserted into apertures 492 formed in the surface of the receptacle 260. In FIG. 4 these apertures 492 are formed on an upper outer surface of the receptacle 260.

The female connector 112 can also include a ground plate 490 in some implementations. The ground plate 490 is configured for insertion, disposition, and/or attachment within the receptacle. For example, in FIG. 4, the ground plate has a substantially elongated rectangular body. Furthermore, the two ends of the ground plate each include an elongated protruding segment 488 configured to protrude outward from the receptacle when the ground plate is inserted within the receptacle (see the cross-sectional view of FIG. 11). The ground plate can also include provisions for secure attachment within the receptacle. For example, in one implementation, a ground plate includes plurality of holes 460. In FIG. 4 the ground plates include four holes, spaced apart at approximately regular intervals. In one implementation, the ground plate is insert-molded into the receptacle. In other implementations, the ground plate 490 may be insert-molded, inserted, or otherwise disposed at least partially in a slot 498 formed in the female connector.

In some implementations, the ground plate functions as an electrical ground conductor body that is electrically connected to one or more electrical contacts (data bars) of the connecting plug. The electrical ground plate may serve to reduce impedance discontinuities and/or improve signal integrity, particularly at higher data transfer rates (for example, speeds of 5 Gbps as a non-limiting example) across an interface of paired electronic connectors. The ground plate may be partially enclosed within at least a portion of the receptacle. In one example, the ground plate includes a flat conductive plate portion that is parallel to and near a symmetry plane of the female connector. For example, the distances from the plate portion to the opposing connection faces may be near the same (i.e., less than 10% difference). In one implementation, the ground plate may be equidistant to the opposing connection faces. In addition, in such implementations, opposing electrical contacts are substantially equidistant from the ground conductor body, and impedance differences between the opposing electrical contacts are reduced or eliminated.

The ground plate 490 may be electrically connected to at least one electrical ground contact of the ground springs. For example, the ground plate may be electrically connected to two or more (i.e., plural) electrical ground contacts of the data springs disposed in the receptacle. In another example, the ground plate may be electrically connected to each or every electrical ground contact of the female electronic connector.

In some implementations, one or more of the ground bar, EMI plate, EMI springs, and/or outer shell may be electrically connected to the ground plate. The ground plate may further reduce leakage of electromagnetic radiation and provide increased shielding of electrical connections. As an example, the ground plate may reduce electromagnetic interaction and/or cross-talk between electrical contacts located on opposing connection faces or surfaces of a tapered extension of an electronic connector. The EMI plate and ground plate can be configured to reduce or shield the system from electromagnetic interference, as will be discussed in greater detail below.

As identified earlier, the male connector 122 includes the housing 220, the board 200, the flexible connector 234, and the first ground bar 232. In this view, it can be seen that there is also a second ground bar 435, where the first ground bar 232 is associated with the first face of the male connector and the second ground bar is associated with the second face of the male connector. The ground bar(s) can vary in size and geometry in different implementations and will be discussed in further detail in FIGS. 6A-6E. In some cases, the flexible connector(s) can be connected to a lower end of the board 200, as shown with flexible connectors 234 and 235.

In different implementations, the board 200 further includes data bars 236 that can function as electrical contact pads. In some implementations, the board 200 is a printed circuit board (PCB), a flexible printed circuit (FPC), a printed wiring board, or a printed wiring card. The use of PCBs or FPCs decreases the labor needed to form the connections, as well as increasing the overall longevity of the connector. For example, the use of a PCB or FPC improves the manufacturing process by removing some or all of the manual steps typically associated with the production of electrical connectors. In addition, the inclusion of a PCB or FPC offers significant improvements in the impedance-matching capacity of the connector, where the speed associated with the connector is greater relative to traditional metal stamped pins. Furthermore, the connectors described herein can be configured to quickly and securely attach and detach by magnetic forces. Thus, magnets can guide the alignment of a connector in a receptacle as well as allow 'off-axis' extraction where a sudden yanking or pull of the cable will not damage the plug.

The base material of the PCB, or substrate, is usually fiberglass, or "FR4". This solid core gives the PCB its rigidity and thickness. Flexible PCBs built on flexible high-temperature plastic (Kapton or the equivalent) can also be utilized. Other layers of the PCB can include copper foil, which may be laminated to the board with heat and adhesive. In some implementations, copper is applied to both sides of the substrate. The layer above the copper foil may be a soldermask layer, which can be overlaid onto the copper layer to insulate the copper traces from accidental contact with other metal, solder, or conductive bits. This layer may also help during manufacture to solder to the correct places and prevent solder jumpers. In addition, in some implementations, a white silkscreen layer is applied on top of the soldermask layer. The silkscreen can be used to add letters, numbers, and symbols to the PCB that allow for easier assembly and indicators for humans to better understand the board, and/or to indicate what the function of each pin or LED. In one implementation, the PCB can be enclosed in the housing by an overmolding process. In some implementations, the flexible connector can be soldered onto the PCB, and the two pieces are encapsulated in the housing by an overmolding process. In one implementation, the housing can include plastic materials, and the ground bars can include metals. However, in some other implementations, the housing may be at least in part manufactured through metal injection molding (MIM), while the ground bar includes plastic materials.

In some implementations, the PCB assembly can include a first EMI shield layer along the outermost layer, as well as a first ground layer, a first data layer, a second ground layer, a second data layer, a third ground layer, and a second EMI shield layer, forming a multi-layer assembly. It should be understood that other materials may also be disposed in the PCB assembly. In one implementation, the EMI shield layer can be a portion of metal that is soldered onto the assembly. Furthermore, the EMI shield layer can be joined to the EMI ground bar so as to provide a substantially complete or complete Faraday cage.

In different implementations, the data bars 236 can be printed or pressed onto the outermost surface of the PCB, and/or added during the manufacture of the PCB. In one implementation, each data bar can include a "gold finger" or "gold plating" to act as connector contacts and can electroplate pads onto the board. These gold fingers can be disposed adjacent to, along, or proximal to the edges of the printed circuit board, and can be relatively long and narrow. In different implementations, flash gold is used to form the data bars. The data bars can be used to provide connections for network transfer data, attach specialty adaptors, connect different devices to the board, and/or be used as audio adaptors.

In some other implementations the plating can include Palladium (Pd) and/or Nickel (Ni). The materials comprising the plating can differ depending on the cycle requirements of the connector(s). In some implementations, a thickness of a plated 'gold finger' can be increased by inclusion of a copper base layer and/or Nickel middle layer along with the gold outer layer. In one example, the total thickness of a data bar or gold finger can be thick enough such that the pins can be substantially submerged in the overmolding while the surface of the pin remains exposed within the PCB. For example, a gold finger may range between 0.1 mm to 0.2 mm in thickness. Thus, the PCB and overmold (housing) can provide protection to the gold fingers while also permitting access for the transmission of signals.

In different implementations, the electrical contacts or data bars may have any suitable shape and/or size. In the examples depicted herein, the externally facing connection surfaces of the electrical contacts have a substantially flat rectangular shape. However, an externally facing connection surface of an electrical contact may have other suitable shapes, including circles, ovals, multi-sided two-dimensional shapes, multi-sided three-dimensional shapes, or any other regular or irregular shape. The electrical contacts depicted in FIG. 4 are of similar shape and size in relation to each other. In other implementations, electrical contacts of an electronic connector may have different shapes and/or sizes in relation to each other.

In at least some configurations, data bars arranged on a connection face may be evenly spaced apart from each other as measured along the horizontal axis 293. In other configurations, electrical contacts may not be evenly spaced apart from each other to provide any number of symmetric or asymmetric contact configurations.

In some implementations, the male connector 122 also includes power bars 230. In FIG. 4, a first power bar set 460

(associated with the first face of the housing 220) and a second power bar set 462 (associated with the second face of the housing 220) are illustrated. In this example, there are six power bars in the first set and six power bars in the second set, though in other implementations, there may be a fewer or greater number of power bars, and/or the number and arrangement of power bars in each set can differ from one another. Furthermore, as shown in FIG. 4, three power bars of the first set disposed on the first face of a first power portion 481 of the board 200 will be associated with a first side portion 205 of the first face of the housing 220, and three additional power bars of the first set disposed on the first face of a second power portion 483 of the board 200 will be associated with the first face of a second side portion 207 of the housing 220. Similarly, three power bars of the second set disposed on the second face of the first power portion 481 will be associated with the second face of the first side portion 205 of the housing 220, and three power bars of the second set disposed on the second face of the second power portion 483 will be associated with the second face of the second side portion 207 of the housing 220. In some implementations, the housing can include recessed regions or apertures 213 for receiving the power bars and/or for connecting the power bars to the traces associated with the board 200. In some implementations, the power bars can be individually hot-barred to the PCB or may be insert-molded to the housing and PCB. In some cases, soldering may be used during manufacture. In one implementation, one or more power bars can be assembled on a panel, and the panel can be attached or disposed onto the PCB or housing via a hot-bar process or other attachment process. In other implementations, the side portions or any other portion of the male connector may not include power bars (see FIGS. 14A and 14B).

Figure 5:
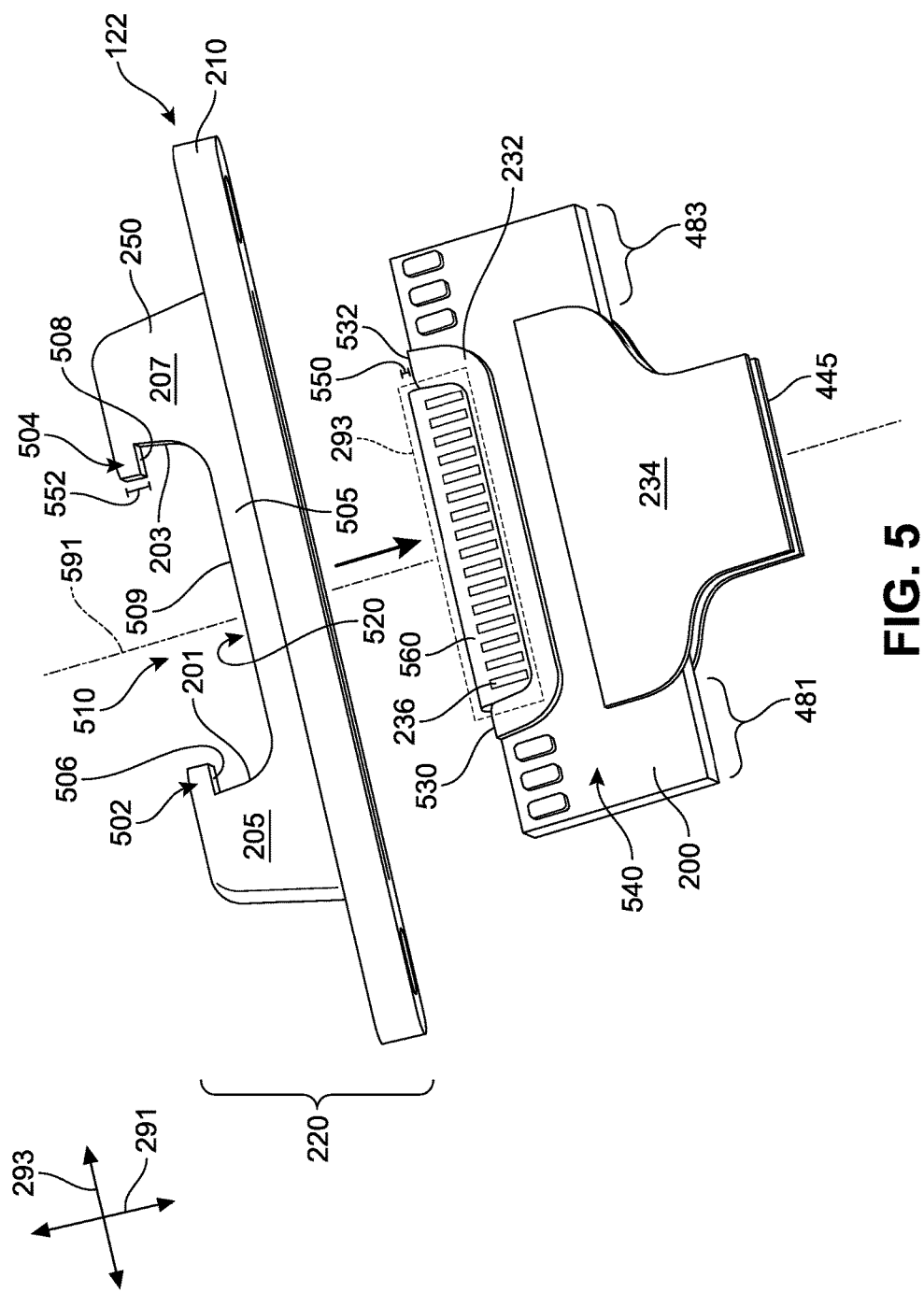
FIG. 5 is an isometric view of an implementation of the male electronic connector of FIG. 4.

Referring next to FIG. 5, additional details regarding the male connector 122 are presented. In the partially exploded view of FIG. 5, the housing 220 has been removed from the remainder of the male connector 122 to better illustrate the board 200, the first flexible connector 234, and the second flexible connector 445. In some implementations, the board 200 can be sized and dimensioned to be snugly inserted into an opening formed in the base 210 of the housing 220. After the board 200 is disposed in the housing 220 (see FIG. 2), the nose 206—including the data bars 236 and the first ground bar 232 and second ground bar (not shown here)— will be positioned in and exposed in a partially enclosed space or mouth 510 formed between the first side portion 205 and the second side portion 207, where the two side portions are spaced apart by a central portion 505 of the housing 220. For purposes of reference, the first inner flank 201 can be understood to form a peripheral side of the first side portion 205 and the second inner flank 203 can be understood to form a peripheral side of the second side portion 207.

In one implementation, the central portion 505 has a substantially rectangular cross-sectional shape, though in other implementations, the central portion 505 can include any other regular or irregular cross-sectional shape. In FIG. 5, the central portion 505 is configured to be disposed directly adjacent or below the nose 206 when the two components are assembled. The shape of the mouth 510 is primarily defined by a continuous inner edge 520 extending along the first flank 201, along an outer border 509 of the central portion 505 of the upper portion 250, and along the second flank 203. In FIG. 5, the inner edge 520 bounds a recessed space in the housing that is substantially U-shaped. The recess is sized and dimensioned to primarily expose the nose 206 while other portions of the board 200 remain enclosed, covered, or contained within the housing 220. For purposes of reference, the portion of the board 200 that is enclosed in the housing 220 will be referred to as a body portion 540.

In different implementations, the housing 220 can include provisions for securing the board 200. For example, each side portion further includes a flange that extends proximally toward a vertical midline 591 of the housing 220. In some implementations, the flanges can be substantially elongated portions, extending in an orientation parallel to the length of the base 210. In FIG. 5, the first side portion 205 includes a first flange 502 and the second side portion 207 includes a second flange 504.

In addition, as noted earlier, one or more ground bars can be sized and dimensioned to form a border around nose 206. In some implementations, a ground bar may be disposed directly adjacent to and or in direct contact with the inner edge 520 when the housing and board are assembled in the male connector. In one implementation, the ground bar has a U-shape corresponding to the U-shape of the inner edge 520. In some implementations, the housing 220 can also include provisions for securing the ground bars to the male connector 122. For example, a first end 530 of the first ground bar 232 can be in contact with or be disposed or pressed flush against a lower face 506 of the first flange 502 and a second end 532 of the first ground bar 232 can be in contact with or be disposed or pressed flush against a lower face 508 of the second flange 504. Thus, the flanges can serve to help secure both the board 200 as well as the ground bars and provide a smooth interface for the connecting plug.

As discussed above, the board 200 includes both the nose 206 and the body portion 540, where the nose 206 extends from the body portion 540. In addition, the nose 206 of the board 200 can include a protruding region 560 that protrudes outward relative to the remainder of the board. In some implementations, the protruding region can be rounded or curved. In one implementation, the protruding region has a substantially half-cylindrical three-dimensional shape. As shown in FIG. 5, the protruding region 560 of the nose 206 has a first height 550 relative to the peripheral sides of the body portion 540 of the board 200. In one implementation, the first height 550 of the protruding region 560 is substantially similar to a second height 552 of the first flange 502 and/or the second flange 504. Thus, in one implementation, the protruding region 560 can be nestled or extend between the first flange 502 and the second flange 504. In one implementation, the nose 206 can thereby be disposed in a flush arrangement or otherwise be aligned with the outer border 509 of the upper portion 250 of the housing 220.

It should be understood that the protruding region 560 can be optional in some implementations. For example, the shape of the protruding region 560 or uppermost portion of the board 200 can vary depending on the machining or manufacturing process used. Thus, in some implementations, the board 200 can be substantially flat or rectangular or otherwise lack a protruding region. In one implementation, the protruding region 560 can be a result of the machined FR4 layer and/or the overmolding process where the overmold encases various portions of the board. In some other implementations, the ground bar can be arranged to extend around the periphery of the board 200 and/or located in the position where the protruding region 560 is shown.

Referring next to FIGS. 6A-6E, additional details with respect to the ground bars and the male connector are provided. In FIG. 6A, an implementation of the board 200 is illustrated, with the first ground bar 232 disposed on the first face 202, a first group of data bars 236 being disposed above the first ground bar 232 on the first face of the nose 206, and a group of power bars 230 arranged on either end of the board, outside of the region enclosed by the first ground bar 232 and also on the first face 202. As noted above, each of these structures are also included on a second face 602 of the board 200, including second ground bar 435. The pair of ground bars is depicted in isolation in FIGS. 6C-6E.

As noted earlier with respect to FIGS. 2 and 3, a wide range of structural variations may be understood to extend from the described implementations. The male connector may not include the peripheral 'power portions' for example, or a single ground bar, or a ground bar positioned and/or arranged in a different orientation. In addition, the female connector may include only one EMI plate, or no power springs (see FIGS. 14A and 14B). In one implementation, the male connector may mainly comprise the printed circuit board and data bars, each shaped, sized, and dimensioned to provide a high-speed connection as needed, and the printed circuit board may itself provide the outermost surface of a male connector. One implementation of a male connector is presented in FIG. 6A, where no housing or flexible connector is included. The arrangement or number of the data bars 236, power bars 230, and/or ground bar(s), as well as the shape of the board 200 can differ from what is shown in FIG. 6A to permit high-speed data transfer connections for another type of device or connecting requirements. Thus, some male connectors may include fewer data bars or more data bars, and/or the bars may be arranged in multiple rows or columns along one face of the board. The ground bar may be shaped and sized to accommodate any structural variations in the board and/or arrangement of the data bars.

Figure 6B:
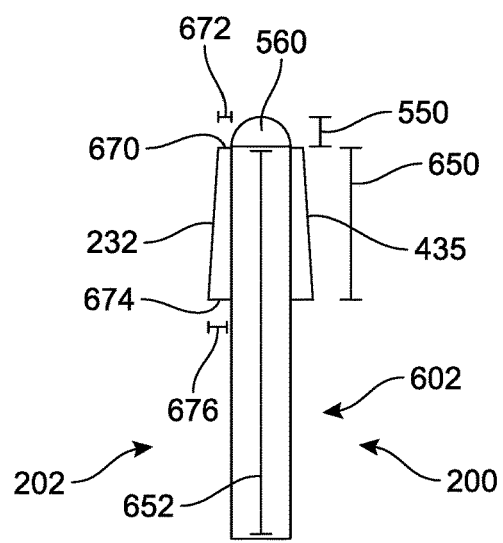

In FIG. 6B, a side view of the board is shown in which the power bars have been removed to illustrate the shape of the arms of the ground bars along their distal surfaces. It can be seen that each arm has a substantially tapered or wedge shape. In some implementations, the ground bar can have a cross-sectional shape in a vertical plane that is substantially trapezoidal. Thus, an upper end 670 of the first ground bar 232 has a fourth width 672 and a lower end 674 has a fifth width 676, where the fifth width 676 is greater than the fourth width 672. FIG. 6B also presents a view of the first height 550 associated with the protruding region 560, a second height 650 associated with the ground bar, and a third height 652 associated with the body of the board 200. In some implementations, the second height 650 can be greater than the first height 550 and smaller than the third height 652. In some implementations, the third height 652 is approximately between two times to three times greater than the second height 650. In one implementation, the third height 652 is approximately 2.5 times greater than the second height 650.

Figure 6C:
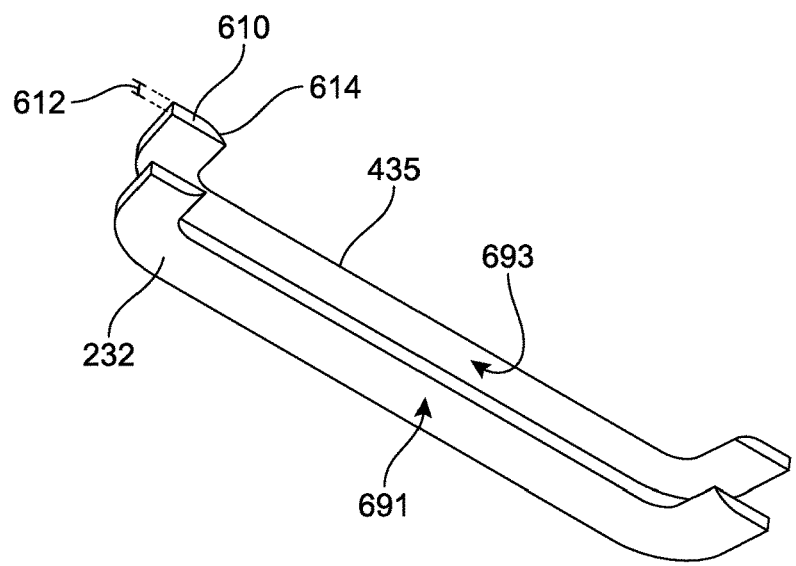

In FIG. 6C, the first ground bar 232 and the second ground bar 435 can be understood to be arranged in a substantially parallel orientation. In some cases, the outwardly facing surfaces 691 of the ground bars can be angled, ramped, or otherwise curved, while the inwardly facing surfaces 693 can be substantially flat to facilitate a secure attachment to the surface of the board. The uppermost surfaces of each ground bar correspond to this geometry. For example, an outer surface 610 of the second ground bar 435 can also represent a cross-sectional view of a ground bar along a horizontal plane. This surface has a shape similar to that of a sail of a sailboat, where the hypotenuse of the triangle is replaced by an arc segment, or a generally curved portion. In some cases, the outer surface 610 is substantially smooth or flat, and can be configured to rest in a flush arrangement against the flanges of the housing (see FIG. 5). Thus, in FIG. 6C, each end of a ground bar has a first thickness 612 that is greater than a second thickness 614. In one implementation, the thicknesses of an end decrease in a direction extending from the first thickness 612 to the second thickness 614, such that second thickness 614 approaches zero. However, in other implementations, the ground bars can have other cross-sectional shapes, including square, triangular, rectangular, oblong, elliptical, pentagonal, or any other regular or irregular shape.

Figure 6D:
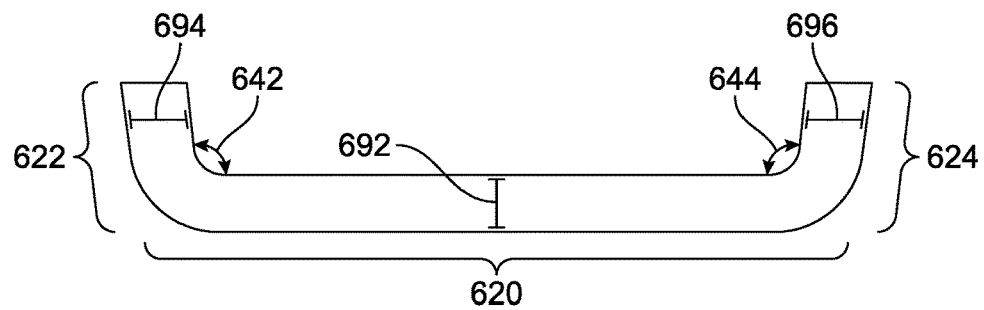

The ground bars can also include a substantially uniform width. For example, as shown in FIG. 6D, the first ground bar 232 has a first width 692 associated with a body portion 620, a second width 694 associated with a first arm portion 622, and a third width 696 associated with a second arm portion 624. Each of first width 692, second width 694, and third width 696 are substantially similar. Thus, the EMI protection provided by the ground bar can be substantially steady or uniform along its boundary. However, in other implementations, the widths can vary, particularly if additional EMI shielding is desired or required by the specifications of the electronic device or connector.

Figure 6E:
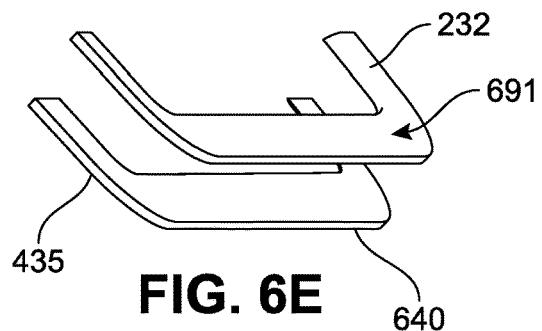

The ground bars can also be substantially symmetrical in some implementations. For example, in FIG. 6D, the first arm 622 and the second arm 624 have a substantially similar shape and size, and can be understood to be mirror images of one another. Similarly, the body portion 620 may include an elongated geometry, with a rectangular cross-sectional shape. In FIG. 6E, it can be seen that a lowermost surface 640 of the body portion 620 also includes a rectangular shape. In other implementations, the ground bar can include a substantially half-cylindrical, or a semi-pipe, tube, or tunnel three-dimensional shape. In different implementations, the ground bar can include any other three-dimensional shape, including regular and irregular shapes. Furthermore, a ground bar may be either hollow or solid, or be partially filled. The ground bar(s) can be soldered onto the PCB in one implementation, though in other implementations, other attachment techniques may be utilized.

In different implementations, the angle at which each arm curves or extends outward from the body portion 620 can vary to correspond to the dimensions and shape of the nose portion of a board. In FIG. 6D, a first angle 642 and a second angle 644 are each substantially similar, and slightly larger than 90 degrees. However, in other implementations, the first angle 642 and second angle 644 can be more obtuse or acute, in order to best enclose the particular data bars arrangement being utilized.

Figure 7:
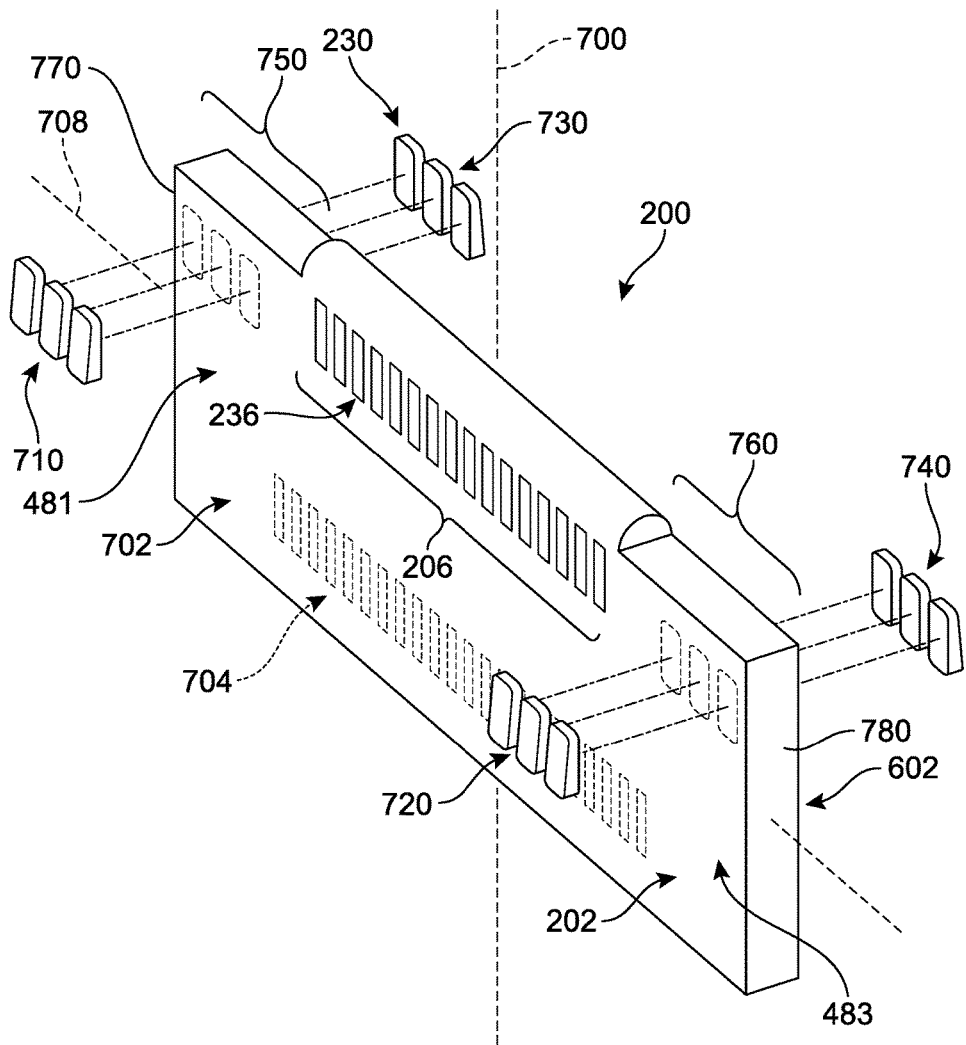
FIG. 7 is an isometric view of an implementation of the circuit board and power bars.

Referring next to FIG. 7, an isometric view of an implementation of the board 200 is illustrated. In FIG. 7, the first face 202 of the board 200 includes sixteen data bars 236, and six power bars 230, arranged symmetrically relative to a first midline 700 of the board 200, as described earlier. In addition, the board 200 is symmetrical, or a mirror-image, on both sides of a second midline 708. In a lower portion 702 of the board 200, a grid 704 including a plurality of recesses or openings can be provided to facilitate connection of the board 200 with another connector (such as the flexible connector). In this example, the power bars 230 have been removed. It can be seen that a first group of power bars 710 may be associated with the first face 202 of a first side portion 750 of the board 200, a second group of power bars 720 may be associated with the first face 202 of a second side portion 760 of the board 200, a third group of power bars 730 may be associated with the second face 602 of the first side portion 750 of the board 200, and a fourth group of power bars 740 may be associated with the second face 602 of the second side portion 760 of the board 200. In some implementations, the first side portion 750 can encompass the entire region of the board extending from the nose 206 to a first edge 770, and the second side portion 760 can encompass the entire region of the board extending from the nose 206 to a second edge 780. Thus, in some implementations, the side portions have a substantially rectangular cross-section. In one implementation, some or all of the first side portion 750 and/or the second side portion 760 can be dedicated to providing a pathway from the power bars to the electronic device connected to the board. Thus, a charging component or energy source can be connected to the power bars to supply power to the electronic device.

Figure 8:
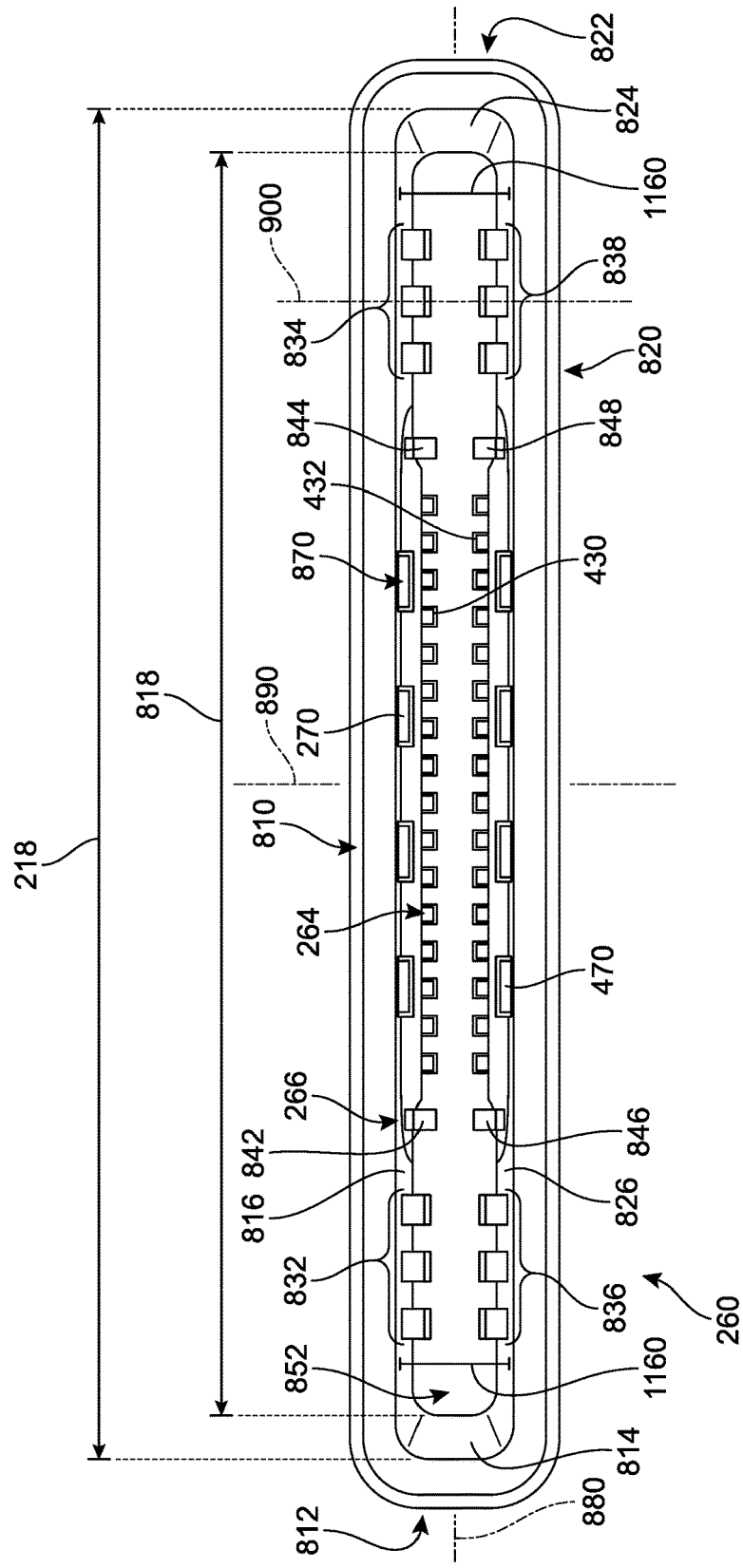
FIG. 8 is a front view of an implementation of the female electronic connector.

In FIG. 8, additional details regarding the female connector 112 are provided with reference to a front-side view of the receptacle 260. For purposes of reference, the outer shell 206 includes a first face 810 and an opposite facing second face 820, as well as a first end 812 and an opposite facing second end 822. In addition, the receptacle 260 can be understood to include a first interior surface ("first surface") 814 proximal to the first end 812, a second interior surface ("second surface") 824 disposed opposite to the first surface and proximal to the second end 822, an interior upper connection surface ("upper surface") 816 proximal to the first face 810, and an interior lower connection surface ("lower surface") 826 disposed opposite to the upper surface and proximal to the second face 820. In addition, the first surface 814 and the second surface 824 can be oriented substantially parallel to one another, and the upper surface 816 and the lower surface 826 can be oriented substantially parallel to one another. In some implementations, a large portion of each of the first surface 814 and/or second surface 824 are substantially perpendicular to each of the upper surface 816 and the lower surface 826.

In different implementations, the receptacle 260 can contain or include a plurality of components or elements. As shown in FIG. 8, the receptacle 260 includes the power springs 268, the EMI springs 266, the data springs 264, and two EMI plates 870. In this view, the power springs 268 can be seen to include a first power spring set 832, a second power spring set 834, a third power spring set 836, and a fourth power spring set 838, where each set includes three power springs. In other implementations there may be greater or fewer power springs. Each of the power springs may be substantially similar in size and shape, though in other implementations, one power spring may differ from another.

In the example of FIG. 8, the first power spring set 832 and the second power spring set 834 are each connected to, extend through, or are otherwise associated with the upper surface 816. Similarly, the third power spring set 836 and the fourth power spring set 838 are each connected to, extend through, or are otherwise associated with the lower surface 826. Further details regarding the structure, position, and path of the power springs in the receptacle will be presented in FIG. 9. In addition, the first power spring set 832 and the third power spring set 836 are proximal to the first surface 814, and the second power spring set 834 and the fourth power spring set 838 are proximal to the second surface 824. Furthermore, the first power spring set 832 is disposed substantially opposite to the third power spring set 836, and the second power spring set 834 is disposed substantially opposite to the fourth power spring set 838. However, in other implementations, the power springs can be arranged to include additional or fewer elements, and may be arranged in a non-symmetrical configuration.

The EMI springs 266 include a first EMI spring 842, a second EMI spring 844, a third EMI spring 846, and a fourth EMI spring 848 (also illustrated in the exploded view of FIG. 4). The first EMI spring 842 and the second EMI spring 844 are each connected to, extend through, or are otherwise associated with the upper surface 816, and each is disposed between a EMI spring and a data spring. Similarly, the third EMI spring 846 and the fourth EMI spring 848 are each connected to, extend through, or are otherwise associated with the lower surface 826, and each is disposed between a EMI spring and a data spring. Further details regarding the structure, position, and path of the EMI springs in the receptacle will be presented in FIG. 11. Furthermore, the first EMI spring 842 is disposed substantially opposite to the third EMI spring 846, and the second EMI spring 844 is disposed substantially opposite to the fourth EMI spring 848. However, in other implementations, the EMI springs can be arranged to include additional or fewer elements, and may be arranged in a non-symmetrical configuration.

In addition, the data springs 264 can be seen to include the first data spring set 430, and the second data spring set 432 (also illustrated in the exploded view of FIG. 4), where each set includes 16 data springs. In the example of FIG. 8, the data springs of the first data spring set 430 are each connected to, extend through, or are otherwise associated with the upper surface 816. Similarly, the data springs of the second data spring set 432 are each connected to, extend through, or are otherwise associated with the lower surface 826. Further details regarding the structure, position, and path of the data springs in the receptacle will be presented in FIG. 13. In addition, the first data spring set 430 and the second data spring set 432 are substantially centered within the receptacle. Furthermore, the first data spring set 430 is disposed substantially opposite to the second data spring set 432. However, in other implementations, the data springs can be arranged to include additional or fewer elements, and may be arranged in a non-symmetrical configuration.

As identified earlier in FIG. 4, the receptacle 260 is further associated with two EMI plates, including the first EMI plate 270 and the second EMI plate 470. Each EMI plate includes four prongs that extend upward from a base portion of the EMI plate. The prongs are shown spaced apart at regular intervals in FIG. 4. The prongs of the first EMI plate 270 are connected to, extend through, or are otherwise associated with the upper surface 816, while the prongs of the second EMI plate 470 are connected to, extend through, or otherwise associated with the lower surface 826. Further details regarding the structure, position, and path of the EMI plates in the receptacle will be presented in FIGS. 9 and 12. In addition, the first EMI plate 270 and the second EMI plate 470 are substantially centered within the receptacle. Furthermore, the first EMI plate 270 is disposed substantially opposite to the second EMI plate 470. However, in other implementations, the EMI plates can be arranged with additional or fewer elements, and may be arranged in a non-symmetrical configuration.

As described above, in some implementations, the receptacle can include provisions for operating with a connecting plug inserted in varying orientations. In this example, the receptacle is symmetrical and mirror-imaged about both a first central axis 880 and a second central axis 890. This can permit a connecting plug to be inserted in a first orientation or in a second orientation that is rotated 180 degrees relative to the first orientation. Furthermore, the receptacle can include provisions for receiving a particular geometry of the connecting plug described herein with respect to the male connector 122. For example, in FIG. 8, the fourth length 218 of the outermost region of the interior cavity 280 can differ from its length in regions further inward to accommodate a tapered or fanged connector shape. Thus, a fifth length 818 is less than the fourth length 218 in some implementations. Furthermore, the fourth length 218 can generally correspond to the second length 214 of the housing 220 (see FIG. 2), and the fifth length 818 of an inner wall 852 can generally correspond to the third length 216 of the housing 220 (see FIG. 2). In other words, the three-dimensional shape of the interior cavity 280 can be sized and dimensioned to correspond or snugly accommodate the three-dimensional shape of the connecting plug.

As noted above, in different implementations, the data springs can provide an inner set of electrical contacts configured to physically contact and establish an electrical connection with respective electrical contacts (data bars) of the male connector. As an example, the first set of data springs can physically contact and establish an electrical connection with the data bars disposed on the first face of the board, and the second set of data springs can physically contact and establish an electrical connection with the data bars disposed on the second (opposing) side of the board in the mated configuration. In a reversible configuration, the first set of data springs can physically contact and establish an electrical connection with the data bars disposed on the second face of the board, and the second set of data springs can physically contact and establish an electrical connection with the data bars disposed on the first (opposing) side of the board in the mated configuration Furthermore, one or more of the data bars and/and data springs can serve as additional ground contacts, and/or may include power, ground, terminal end, and signal contacts. The receptacle 260 may optionally include one or more terminal end electrical contacts located at or along a terminal end of an interior surface of receptacle 260. In some implementations, the receptacle 260 optionally may include additional electrical contacts and/or retaining springs.

Figure 9:
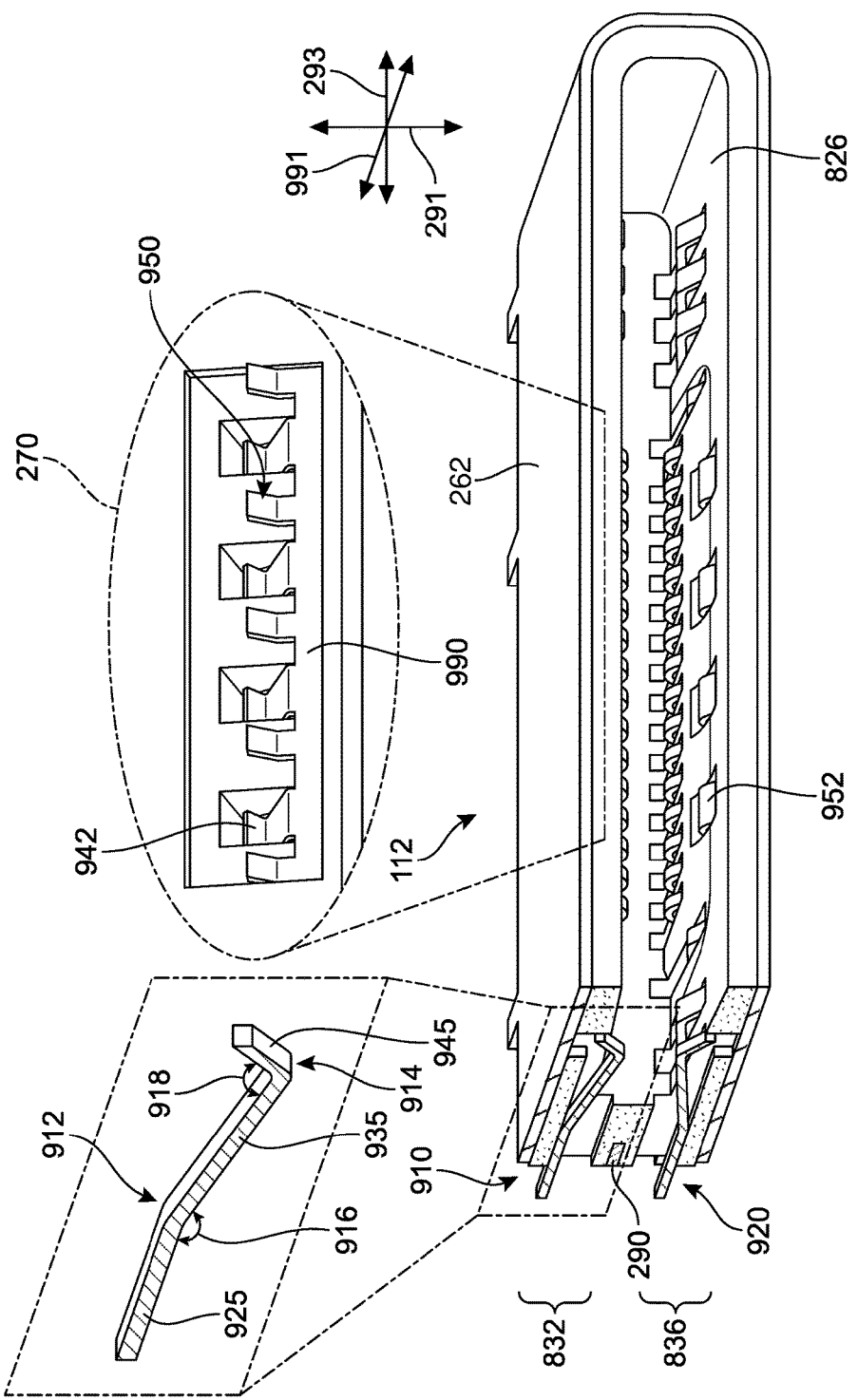
FIG. 9 is an isometric cutaway view of an implementation of the female electronic connector.

Referring next to FIG. 9, an isometric cutaway view of the female connector 112 is illustrated. In FIG. 9, a slice has been made along an axis 900 identified in FIG. 8. The slice provides a view of the shape and path of the power springs in the female connector 112. For example, a portion of a first power spring 910 of the second power spring set 834 and a portion of a second power spring 920 of the fourth power set 838 can be seen. Each power spring has a substantially elongated shape that extends from a rear portion of the receptacle toward a central region in the receptacle. The elongated spring can be bent at various regions, as will be described below. In one implementation, a channel and/or aperture is formed within the receptacle to accommodate the insertion, pathway, or placement of the power spring.

For purposes of reference, the first power spring 910 has two joints, including a first joint 912 and a second joint 914. A first segment 925 extends from the first joint 912 to a first end of the first power spring 910, a second segment 935 extends between the first joint 912 and the second joint 914, and a third segment 945 extends from the second joint 914 to a second end of the first power spring 910. In one implementation, one or more segments can be substantially linear. In some implementations, the first segment is substantially parallel to the ground plate 490. As shown in FIG. 9, the particular structure of the power spring is configured to facilitate the mating process between the female and male connectors. When the male connector is inserted into the female connector and the connecting plug (specifically the power portion) thereby pushes into the space between the first power spring 910 and the second power spring 920, the first joint 912 can allow bending of the second segment 935 relative to the first segment 925 and help accommodate the thickness of the connecting plug, such that a first angle 916 increases. In addition, in some implementations, the second joint 914 can allow bending of the third segment 945 relative to the second segment 935, such that a second angle 918 increases. This bending is also associated with an elastic force that helps provide a more secure connection between the male and female connectors and a stable transfer of power between the power bars and the power springs.

A top-down view of the first EMI plate 270 is also illustrated in FIG. 9. In this view, the four prongs of the EMI plate are visible, dipping downward from a main body portion ("main body") 990 of the EMI plate into a plurality of recesses formed in the receptacle. The lower ends of the prongs shown in FIG. 9 are also shown in the isometric cutaway view below. For example, a first prong 942 in FIG. 9 has a partially curved or curled structure. This arrangement facilitates contact between the ends of each prong with the ground components when the male connector is inserted into the receptacle (see FIG. 10) while allowing smooth coupling and decoupling of the connectors. For example, the opposite surface of the prong is represented by a second prong 952 visible in the lower surface 826 of the receptacle. In some implementations, the EMI plate also includes a plurality of arms 950 that are configured to rest on an outer surface of the receptacle 260 and help secure the EMI plate in the female connector as well as increase the EMI protection. Further details regarding the structure of the EMI plate will be provided with reference to FIG. 12 below.

Figure 10:
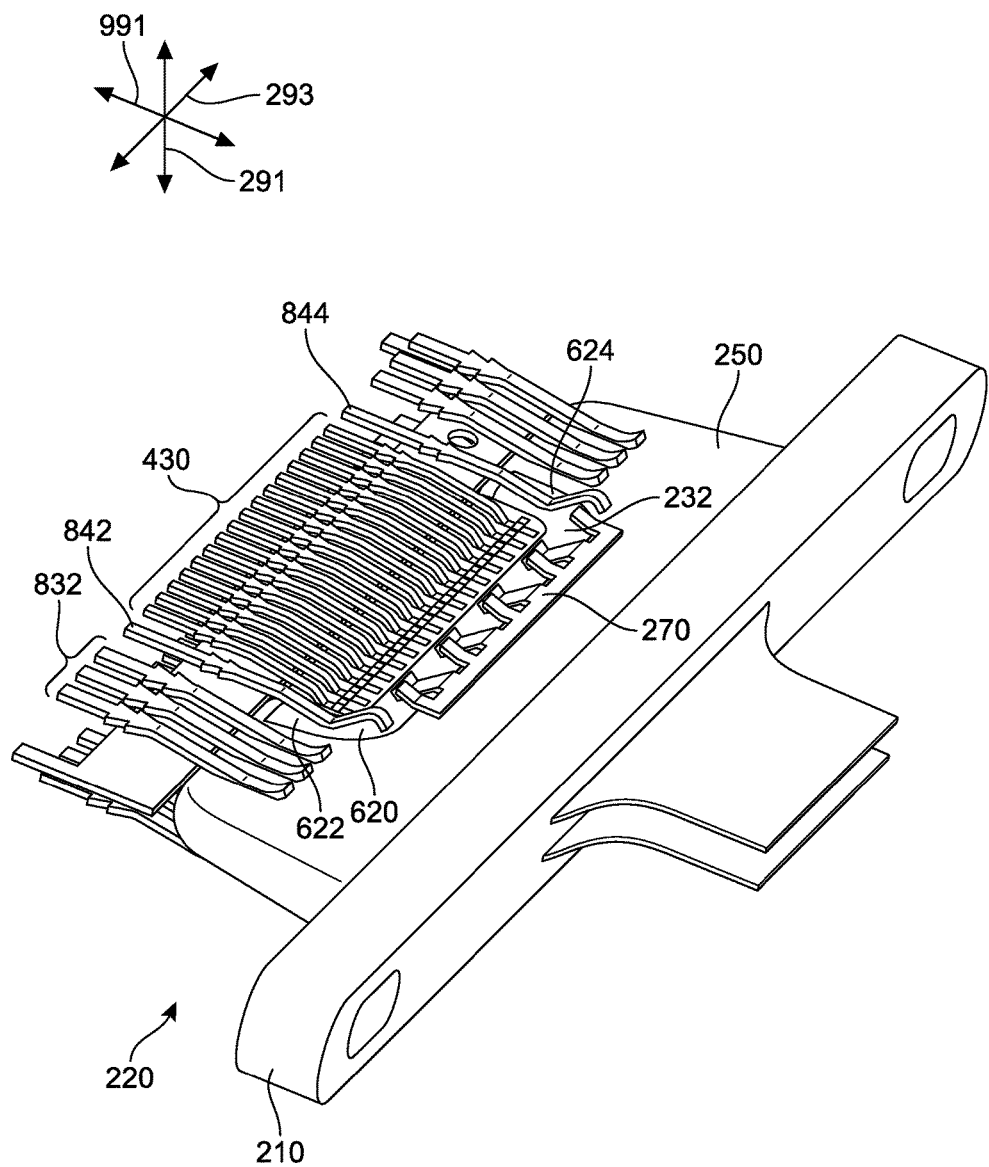
FIG. 10 is an isometric view of the mated pair of electronic connectors with the outer housing of the female electronic connector removed.

For purposes of clarity, FIG. 10 provides an isometric view of a mated pair of electronic connectors where an outer portion (e.g., a portion of the ground outer shell) has been removed to reveal internal components and expose the various contact regions between different components or elements. For example, an end of each data spring of the first set of data springs 430 is in contact with the pads provided by a corresponding data bar (not visible in this figure) disposed on the board. In addition, an end of each power spring of the first set of power springs 832 is in contact with the pad provided by a corresponding power bar (not visible in this figure) associated with the housing 220. Similarly, the first EMI spring 842 has a region that is in contact with the first arm portion 622 of the first ground bar 232. In addition, an end of the first EMI spring 842 is curved and can contact, cradle, or clasp a portion of the ground bar. Finally, each of the prongs of the first EMI plate 270 is in contact with the body portion 620 of the first ground bar 232.

The ground bars as depicted herein can include a three-dimensional shape configured to substantially surround the data bars on the board, and function to generate a highly effective Faraday cage to minimize the effects of radiation. The ground bar, in combination with the electrical contacts, substantially surrounds signal and power contacts located at a forward end or nose of the connecting plug and/or corresponding contacts located within an inner region of the receptacle. The ground bar and surrounding ground pathways serve to further reduce leakage of electromagnetic radiation and provide increased shielding of electrical connections. In some use-scenarios, this collection of grounding elements may act as a Faraday cage that surrounds signal and power contacts in multiple dimensions. The various forms of shielding may collectively enable data transfer rates above 5 GHz (or 10 Gpbs per differential signal pair) while maintaining electromagnetic radiation leakage below regulatory levels.

In different implementations, the ground bar can be contacted at multiple contact points or regions to produce a more robust Faraday cage. In FIG. 10, it can be seen that the first ground bar 232 is contacted by the first EMI spring 842 at a first contact region along its first arm portion 622, and the first ground bar 232 is also contacted by the second EMI spring 844 at a second contact region along its second arm portion 624. In addition, the first ground bar 232 is contact at four separate regions along its body portion 620, here via the four prongs extending from the EMI plate, arranged to contact the ground bar at substantially regular intervals along its surface. In other implementations, the contacts can occur along other regions, fewer regions, or additional regions.

Figure 11:
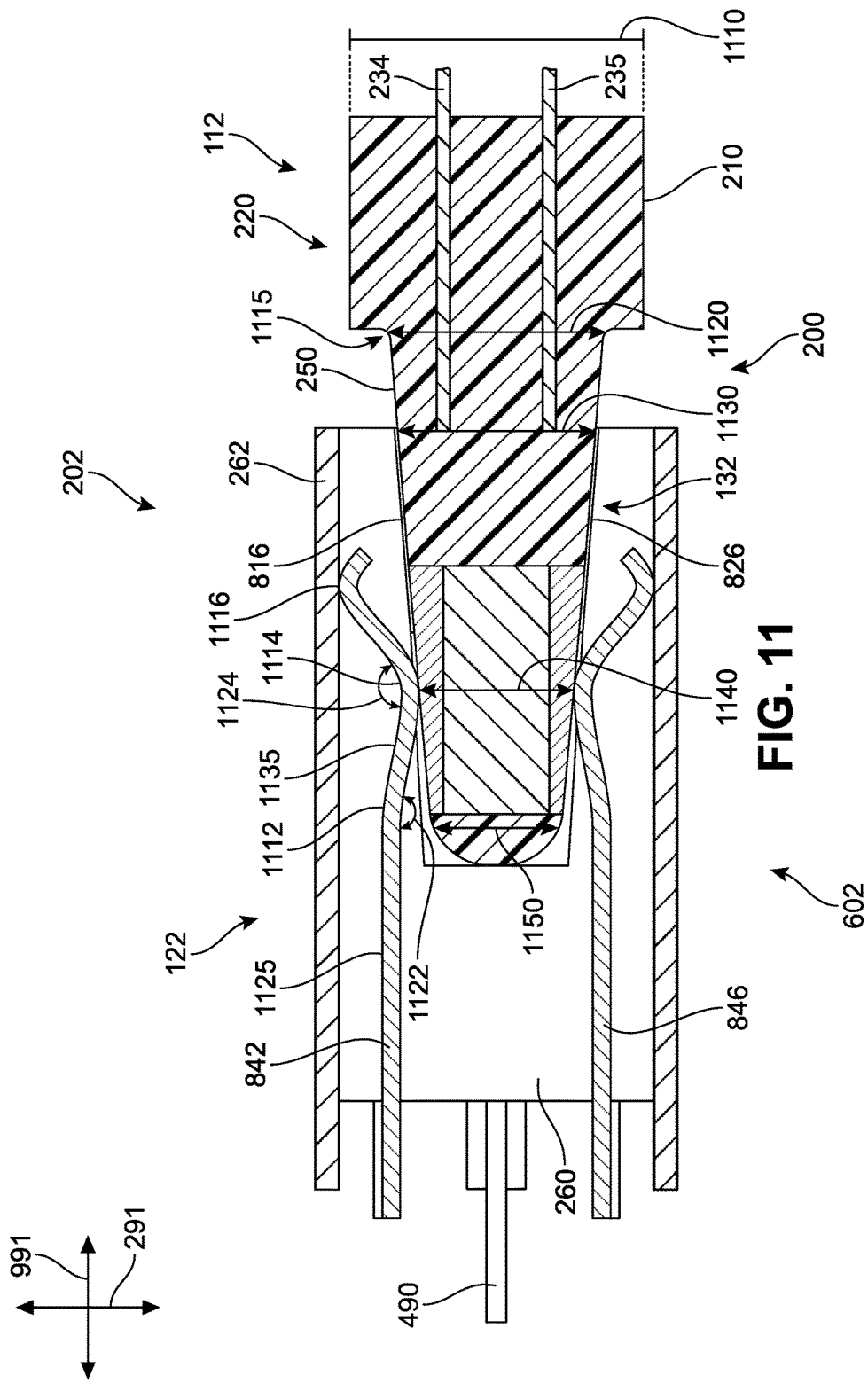
FIG. 11 is a cross-section view of an implementation of the mated pair of electronic connectors illustrating a spring component.

FIG. 11 presents a cross-sectional view of the mated pair of connectors taken along an axis 1100 labeled in FIG. 3. As noted earlier, in some implementations, opposing surfaces (first face 202 and opposing second face 602) of the upper portion 250 and associated connecting plug 132 can be inclined at an angle relative to the YZ-coordinate plane. In one example, this angle may have a magnitude of 6 degrees. In another example, this angle may have a magnitude selected from the range of 5 degrees to 7 degrees. In yet another example, this angle may have a magnitude selected from the range of 1 degree to 10 degrees. In still further examples, this angle may have a magnitude selected from the range of >0 degrees to 45 degrees. In still further examples, this angle may have a magnitude of zero to provide parallel opposing surfaces of a tapered extension or connecting plug. In still further examples, opposing surfaces of the two sides or faces may be inclined at angles having different magnitudes relative to each other as measured in relation to the YZ-coordinate plane.

The two inclined or ramped surfaces of the connecting plug 132 can also be described by reference to a change in thickness of the housing 220 from one end to the other. For example, in FIG. 11, the housing 220 includes a first thickness 1110 associated with an end of the base 210, a second thickness 1120 at an interface 1115 between the upper portion 250 and the base 210, a third thickness 1130 associated with the opening of the receptacle 260, a fourth thickness 1140 toward a middle region of the upper portion 250, and a fifth thickness 1150 associated with a tip region 1152 of the upper portion 250. In FIG. 11, the first thickness 1110 is greater than the second thickness 1120, and second thickness 1120 is greater than the third thickness 1130. Furthermore, the third thickness 1130 is greater than the fourth thickness 1140, and the fourth thickness 1140 is greater than the fifth thickness 1150. In other words, the connecting plug 132 gradually tapers or decreases in thickness as it moves from the interface 1115 to the tip region 1152.

In different implementations, the female connector 112 can include provisions for receiving at least a portion of the connecting plug 132. In FIG. 8, a height 1160 of the opening into the interior cavity is large enough to accommodate the thickness of the connecting plug 132, as illustrated by the third thickness 1130 in FIG. 1. In addition, the opening gradually decreases in height as it approaches the inner wall 852 of the receptacle, as shown in FIG. 8 where a second height 1170 is smaller than the first height 1160.

FIG. 11 also provides a cross-sectional view of the first EMI spring 842 and third EMI spring 846. Each EMI spring has a substantially elongated shape that extends along the lateral axis 991 (perpendicular to both the horizontal axis and the vertical axis) from a rear portion of the female connector toward a central region in the receptacle. The cross-sectional view also reveals the first EMI spring 842 extending along the vertical axis 291 from contact with the outer shell 262 and through the upper surface 816 of the receptacle 260. Similarly, the second EMI spring 846 can be seen extending from the outer shell 262 and through the lower surface 826 of the receptacle 260. In one implementation, a channel is formed within the receptacle to accommodate the insertion, pathway, or placement of an EMI spring. In one implementation, slots or apertures are formed in the receptacle to allow contact between the EMI springs and ground (see FIG. 4). For purposes of reference, the first EMI spring 842 has three joints, including a first joint 1112, a second joint 1114, and a third joint 1116. A first segment 1125 extends from the first joint 1112 to a first end of the first EMI spring 842, a second segment 1135 extends between the first joint 1112 and the second joint 1114, and a third segment 1145 extends from the second joint 1114 to a second end of the first EMI spring 842. In some implementations, the first segment 1125 is substantially parallel to the ground plate 490. Furthermore, in one implementation, the third segment 1145 includes an end portion that is at least partially curled or curved inward, or approximately J-shaped. In some cases, the particular structure of the EMI spring is configured to facilitate the mating process between the female and male connectors and ensure stable contact between the EMI spring and the ground bar while allowing coupling and decoupling of the connectors to easily occur. Thus, in one implementation, the EMI plate and EMI springs of a receptacle can provide sufficient contact points between the EMI shielding of the male connector (including the ground bars and the EMI layer of the PCB), and the EMI shielding (metal outer shell) of the female connector. In some implementations, the spacing between the contact points should be less than 1/20 the wave length of the high-speed signal being used. Thus, as an example, if a 10 GHz signal is used, the spacing can correspond to 1.5 mm.

When the male connector is inserted into the female connector and the connecting plug 132 thereby pushes into the space extending between the first EMI spring 842 and the second EMI spring 846, the first joint 1112 can allow bending of the second segment 1135 relative to the first segment 1125, such that a first angle 1122 increases. Such bending can help accommodate a variable or tapered thickness of a connecting plug, and in particular, the inclined, tapered, or curved shape of the ground bar. This bending is also associated with an elastic force that facilitates a snug, secure connection between the male and female connectors. In addition, in some implementations, the second joint 1114 can allow bending of the third segment 1145 relative to the second segment 1125, such that a second angle 1118 increases. This elasticity can help to move the third segment 1145 down or lower, and better encapsulate or hold the ground bar in the mated configuration. The curvature of the third segment 1145 forms a kind of support arm or shelf that can wrap around a portion of the ground bar and improve the stability of the system.

Figure 12:
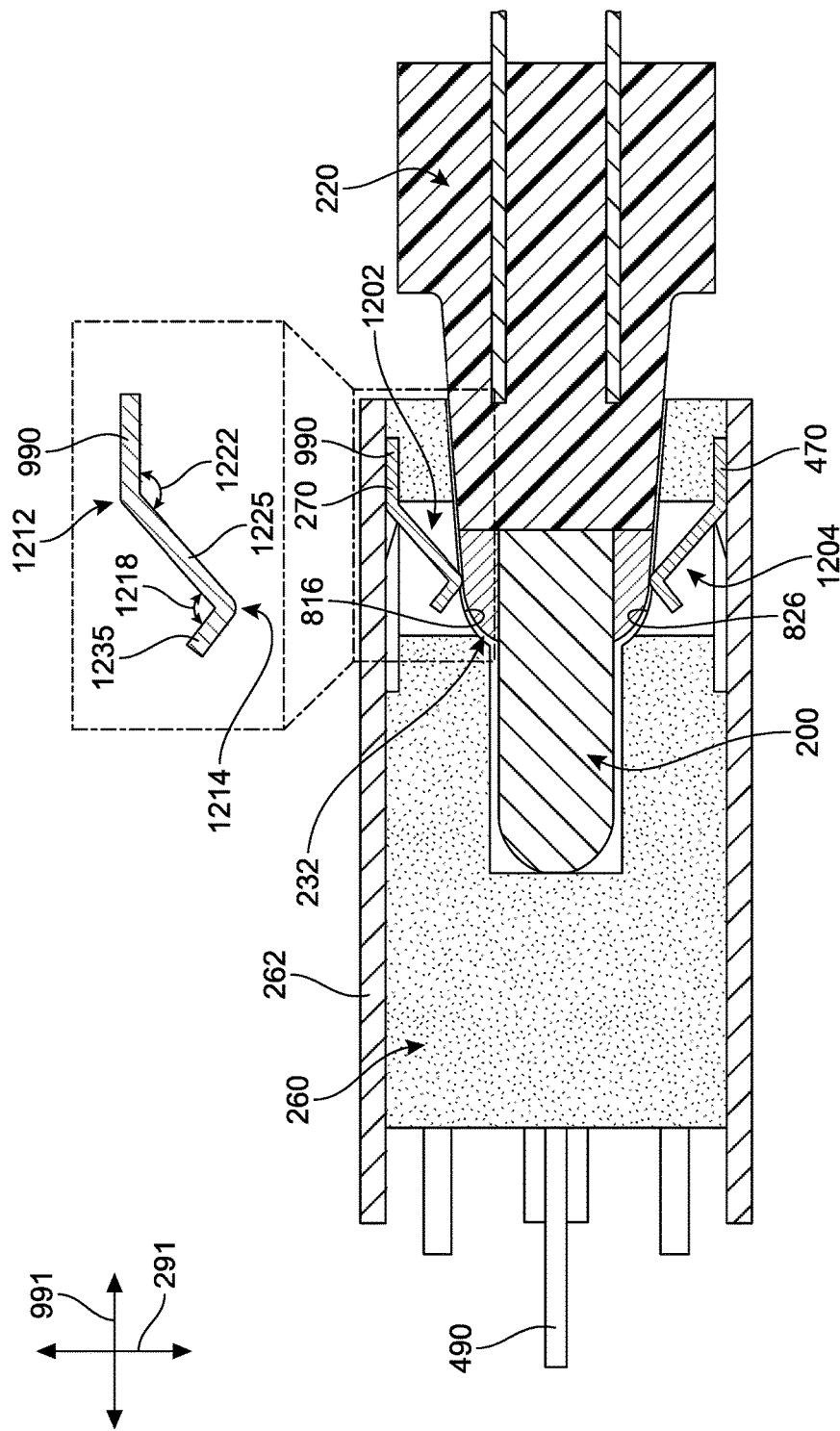
FIG. 12 is a cross-section view of an implementation of the mated pair of electronic connectors illustrating a portion of a plate component.

In FIG. 12, a cross-sectional view of the mated pair of connectors taken along an axis 1200 labeled in FIG. 3 is presented. A cross-sectional view of a first prong 1202 reveals the first prong 1202 extending from the outer shell 262 and through the upper surface 816 of the receptacle 260. Similarly, a second prong 1204 can be seen extending from the outer shell 262 and through the lower surface 826 of the receptacle 260. In one implementation, channels and/or apertures are formed within the receptacle to accommodate the insertion, pathway, or placement of the prongs. In one implementation, slots or apertures are formed in the receptacle to allow contact between the prongs and ground. It should be understood that the first prong 1202 is a portion of the first EMI plate 270 and the second prong 1204 is a portion of the second EMI plate 470. The first prong 1202 and the second prong 1204 are disposed directly opposite one another in this example, in a mirror-image arrangement. Each prong has a substantially elongated shape that curves at an end in an approximate L-shape. For purposes of reference, the first prong 1202 has two joints, including a first joint 1212 that is proximal to the main body 990 of the first EMI plate 270 and a second joint 1214 that is proximal to the first ground bar 232. A first segment 1225 extends between the first joint 1212 and the second joint 1214, and a second, smaller segment 1235 extends from the second joint 1114 to an end of the first prong 1202. In one implementation, the particular structure of the prongs shown herein is configured to facilitate the mating process between the female and male connectors and ensure stable contact between the EMI plate and the ground bar. In some implementations, the first segment 1225 is substantially parallel to the ground plate 490.

When the male connector is inserted into the female connector and the connecting plug thereby pushes into the space extending between the first prong 1202 and the second prong 1204, the first joint 1212 can allow bending of the first segment 1225 relative to the main body 990 of the first EMI plate 270, such that a first angle 1222 decreases. Such bending can help accommodate a variable or tapered thickness of a connecting plug, and in particular, the curved shape of the ground bar. This bending is also associated with an elastic force that facilitates a snug, secure connection between the male and female connectors. In addition, in some implementations, the second joint 1114 can allow bending of the second segment 1235 relative to the first segment 1225, such that a second angle 1218 increases.

Referring next to FIG. 13, an isometric cutaway view of the mated connectors is illustrated. In FIG. 13, a slice has been made along an axis 1300 identified in FIG. 3. The slice provides a view of the shape and path of the data springs in the female connector 112. For example, a first data spring 1310 of the first data spring set 430 and the second data spring 1320 of the second data set 432 can be seen. Each data spring has a substantially elongated shape that extends from a rear portion of the receptacle toward a central region in the receptacle. In one implementation, a channel and/or aperture is formed within the receptacle to accommodate the insertion, pathway, or placement of a data spring. For purposes of reference, the first data spring 1310 has two joints, including a first joint 1312 and a second joint 1314. A first segment 1325 extends from the first joint 1312 to a first end of the first data spring 1310, a second segment 1335 extends between the first joint 1312 and the second joint 1314, and a third segment 1345 extends from the second joint 1314 to a second end of the first data spring 1310. In some implementations, the first segment 1325 and the second segment 1335 are substantially linear, while the third segment 1345 includes a kink or a C-shape curve. In some implementations, the first segment 1325 is substantially parallel to the ground plate 490. As shown in FIG. 13, the particular structure of the data spring is configured to facilitate the mating process between the female and male connectors. In one implementation, the data springs can include a partially curved or curled structure in the region configured to contact the data bars. This curvature can facilitate contact between the two components, as well as allow smooth coupling and decoupling of the connectors.

When the male connector is inserted into the female connector and the nose portion 206 containing the plurality of data bars pushes into the space between the first data spring 1310 and the second data spring 1320, the first joint 1312 can allow bending of the second segment 1335 relative to the first segment 1325 and help accommodate the thickness of the connecting plug, such that a first angle 1316 increases and the second segment moves closer to an inner surface of the receptacle (the upper surface 816 in this example). In addition, in some implementations, the second joint 1314 can allow bending of the third segment 1345 relative to the second segment 1335, such that a second angle 1318 increases. This bending is also associated with an elastic force that helps provide a more secure connection between the male and female connectors and a stable transfer of data between the data bars and the data springs. In FIG. 13, it can be seen that an elbow portion 1352 of the first data spring 1310 is pressed against or rests securely atop the surface of a first data bar 1350.

Figure 14A:
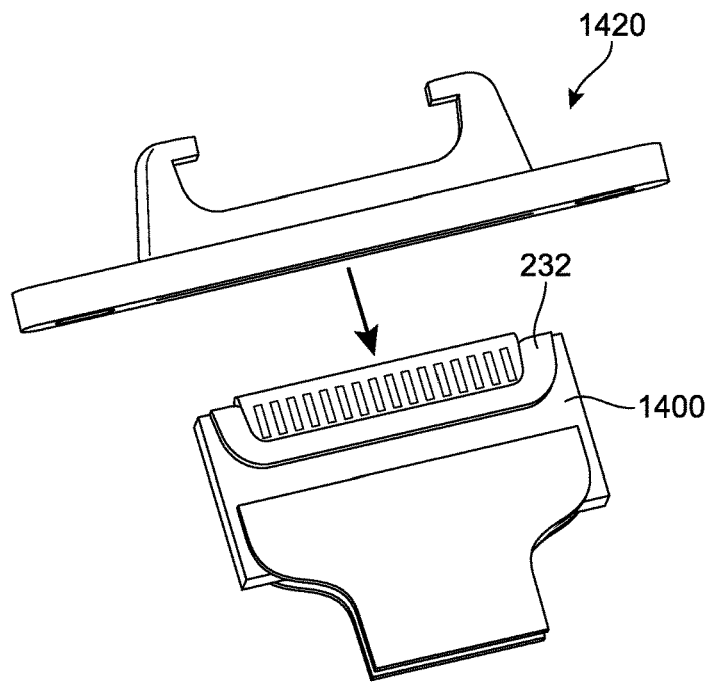
FIGS. 14A and 14B are isometric views of an alternate implementation of the male electronic connector.
Figure 14B:
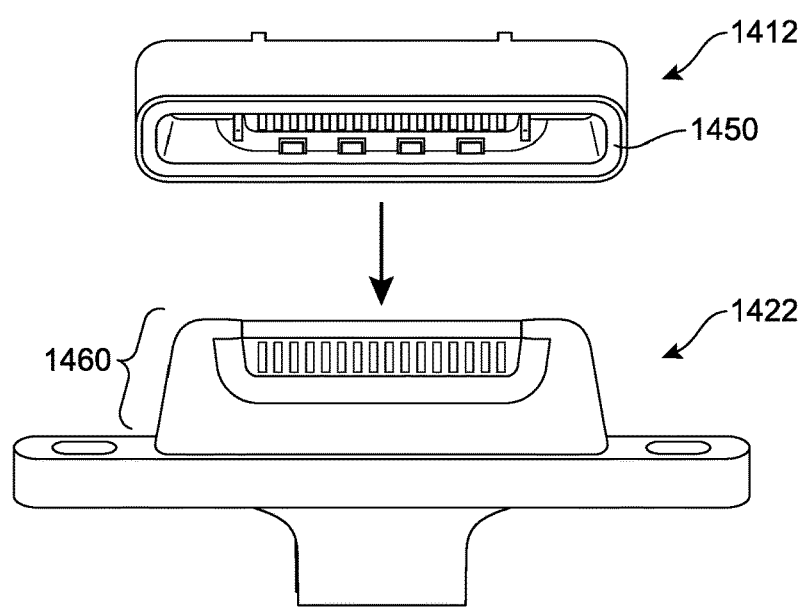

In alternate implementations, the board described herein may be modified to accommodate systems in which a power bar portion is not necessary. Referring to FIG. 14A, an exploded view of a smaller board 1400 is depicted adjacent to a smaller housing 1420. The board 1400 can be substantially similar to the board 200 described earlier with respect to FIGS. 1-13, and include similar features and functions. However, the two power portions (see FIG. 4) disposed on either side of the nose of the board have been removed, providing an abbreviated male connector, as well as housing 1420 that is sized and dimensioned to receive the smaller board 1400. In FIG. 14B, the assembled male connector 1422 is depicted adjacent to a smaller female connector 1412. In FIG. 14B, the width and height of a receptacle 1450 is reduced to provide a snug fit for the connecting plug 1460. Thus, in cases where the electronic devices need not be charged via the mated connection pairing, the system can be significantly smaller and reduce the EMI effects while remaining as highly effective in the transfer of data.

For purposes of reference, FIG. 15 depicts an example pin-out configuration for an electronic connector. The electronic connector corresponding to the pin-out configuration of FIG. 15 may take the form of a female electronic connector, such as example female connector 112 of FIG. 1, or the female connector 1412 of FIG. 14. Alternatively, the electronic connector of FIG. 15 may take the form of a male electronic connector, such as the male electronic connector 122 of FIG. 1, or the male connector 1422 of FIG. 14.

A first group of electrical contacts includes twenty-four (24) electrical contacts, numbered 1-24, that are divided among five regions of the connecting plug (male connector) or receptacle (female connector), is presented in the top row of the first table and continues in the top row of the second table. Within the first group, electrical contacts numbered 1-3 form part of a first power set, electrical contact numbered 4 forms part of a first ground, electrical contacts numbered 5-20 form part of a first data pad set, electrical contact numbered 21 forms part of a second ground, and electrical contacts numbered 22-24 form part of a second power set. As an example, each electrical contact of the first group may take the form of a first set of electrical contacts located along a first connection face of a male electronic connector. As another example, each electrical contact of the first group may take the form of a first inner set of electrical contacts located within a female electronic connector located on an upper surface of a receptacle.

A second group of electrical contacts includes twenty-four (24) electrical contacts, numbered 25-48, that are divided among five regions of the connecting plug (male connector) or receptacle (female connector), is presented in the bottom row of the first table and continues in the bottom row of the second table. Within the second group, electrical contacts numbered 25-27 form part of a third power set, electrical contact numbered 28 forms part of a third ground, electrical contacts numbered 29-44 form part of a second data pad set, electrical contact numbered 45 forms part of a fourth ground, and electrical contacts numbered 46-48 form part of a fourth power set. As an example, each electrical contact of the second group may take the form of a second set of electrical contacts located along a second connection face of a male electronic connector. As another example, each electrical contact of the second group may take the form of a second inner set of electrical contacts located within a female electronic connector located on a lower surface of a receptacle.

In this example, electrical contact numbered 1 is located along an opposing connection face from electrical contact numbered 48, and electrical contact 24 is located along an opposing connection face from electrical contact numbered 25. Intermediate electrical contacts are numbered in sequential order as arranged along each connection face.

For purposes of reference throughout this disclosure, VSLP refers to power, HPD1A refers to Hot Plug Detect 1A, HPD2A refers to Hot Plug Detect 2A, HPD1B refers to Hot Plug Detect 1B, HPD2B refers to Hot Plug Detect 2B, GND/Detect refers to a ground path and/or Detect pin, EMI GND refers to a ground path associated with the ground bar, GND refers to a ground path, TX1+ refers to a data transmit path (data plus), TX1− refers to a data transmit path (data minus), TX2+ refers to a data transmit path (data plus), TX2− refers to a data transmit path (data minus), GND/CC3 refers to a ground path and/or a coaxial cable pin, GND/CC4 refers to a ground path and/or a coaxial cable pin, TX3+ refers to a data transmit path (data plus), TX3− refers to a data transmit path (data minus), TX4+ refers to a data transmit path (data plus), TX4− refers to a data transmit path (data minus), CC1 refers to a coaxial cable pin, CC2 refers to a coaxial cable pin, D+ refers to a data plus path, D− refers to a data minus path, RX1+ refers to a data receive path (data plus), RX1− refers to a data receive path (data minus), R2+ refers to a data receive path (data plus), RX2− refers to a data receive path (data minus), RX3+ refers to a data receive path (data plus), RX3− refers to a data receive path (data minus), RX4+ refers to a data receive path (data plus), and RX4− refers to a data receive path (data minus).

In other implementations, alternate or additional signal types may be assigned to an electrical contact. For example, one or more electrical contacts can include: PCIe_RX referring to a Peripheral Component Interconnect (PCI) express receive path, PCIe_TX referring to a PCI express transmit path, USB3_RX referring to a Universal Serial Bus (USB) 3.0 receive path, USB3_TX referring to a USB 3.0 transmit path, USB2 referring to a USB 2.0 D+(data plus) and/or D− (data minus) paths, PRST# referring to Power-on reset, SAM_RX referring to Sensor Aggregator Module receiver path, DP_HPD referring to DisplayPort Hot Plug, DP_L referring to DisplayPort Lane, DP_CONFIG referring to DisplayPort configuration, AUX referring to Auxiliary channel, Hard Reset referring to Hardware Reset, GC6_FB_EN referring to Gold Candidate Six Feedback Enable, Clock referring to PCIe reference clock, GPU event referring to Graphics Processing Unit event, and/or CLK_REQ referring to PCIe clock request.

In different implementations, two or more PCB interconnects are used to establish electrical connections between the electronic connector and one or more components of an electronic device. However, in other examples, a single PCB interconnect may be used, or three or more PCB interconnects may be used to establish an electrical connection between the electronic connector and electronic device components. In still further examples, PCB interconnects may be omitted, such as if electrical contacts of an electronic connector are directly wired to or otherwise electrically connected to one or more PCBs of an electronic device. Some or all of the electrical pathways may take the form of flexible wiring. The use of flexible wiring may aid in the manufacturing and assembly of an electronic device that incorporates an electronic connector. However, in other examples, non-flexible electrical pathways may be used to connect an electronic connector to electronic device components.

As an example, an electrical pathway associated with VSLP may take the form of an individual wire while other electrical pathways may each include a plurality of coaxial wires in which each non-ground electrical contact is connected by a conductor core of a respective coaxial wire and each ground electrical contact is connected by one or more shielding sheaths the coaxial wires.

As previously described electrical contacts of a male electronic connector and/or of a female electronic connector may be electrically connected to a common ground bar or ground plate that is in turn electrically connected to one or more electrical pathways (e.g., one or more shielding sheaths of coaxial wires) of the ground contacts depicted in FIG. 15.

While FIG. 15 depicts an example pin-out configuration for an electronic connector, it will be understood that other suitable pin-out configurations may be used, depending on implementation. As an example, some pin-out configurations may support or preclude reversibility of an electronic connector between two different orientations in a mated configuration with another electronic connector. As another example, a male electronic connector and/or a female electronic connector may include power contacts and some or all of the ground contacts, but may not include some or all of the signal contacts. This example may be used in configurations supporting battery charging or power supply modes of operation.

In different implementations, the first group and the second group of electrical contacts may include any suitable quantity of electrical contacts. As one example, each connection face may include six or less, eight, ten, twelve, fourteen, sixteen, eighteen, twenty, or even greater quantities of electrical contacts. Symmetrical configurations will generally include an even number of electrical contacts, although symmetrical configurations may include an odd number of electrical contacts with a centered ground contact. Asymmetrical even and odd number configurations are within the scope of this disclosure and may provide a mechanism for detecting male connector orientation. In at least some configurations, the first and second groups of electrical contacts may each have the same quantity of electrical contacts.

In some examples, one or more electrical contacts described herein may be omitted (e.g., omitted signal contacts in configurations supporting battery charging or power supply modes of operation). A corresponding region of the connection faces where omitted electrical contacts would otherwise reside may be recessed or portions of the tapered extension may be gapped or otherwise omitted.

The electronic connectors described herein may be constructed using a variety of manufacturing techniques including, as non-limiting examples: plastic injection molding, inset molding, and overmolding for tapered extension and base components of the electronic connector; and metal blanking, forming, and stamping for electrical contacts and other conductive components. Manual and/or automated assembly processes may be used to combine connector components. The back end of the electrical contacts may be soldered to a paddle card (e.g., a PCB) or wired directly to cable wires. The base of the electronic connector and paddle card then may be overmolded with plastic, as an example.

In at least some implementations, outward facing surfaces of the first group of electrical contacts may be substantially flush with the surface or connection face upon which they are disposed, and outward facing surfaces of the second group of electrical contacts may be substantially flush with the surface or connection face upon which they are disposed. Flush connection faces may provide smooth insertion of the electronic connector into a receptacle of another electronic connector or withdrawal of the electronic connector from the receptacle. Flush connection faces may also improve connector cleanliness and facilitate connector cleaning. Such cleaning may be manual or due to, for example, friction during insertion and withdrawal. In other implementations, outward facing surfaces of electrical contacts may be recessed or protrude relative to the first connection face and/or second connection face.

Electrical contacts may have any suitable shape and/or size. In the example depicted in FIGS. 1-4, externally facing connection surfaces of the electrical contacts have a flat rectangular shape. However, an externally facing connection surface of an electrical contact may have other suitable shapes, including circles, ovals, multi-sided two-dimensional shapes, multi-sided three-dimensional shapes, etc. The electrical contacts depicted in FIGS. 1-4 are of similar shape and size in relation to each other. In other configurations, electrical contacts of an electronic connector may have different shapes and/or sizes in relation to each other.

As the use of electronical devices increases, the exposure of a device or component to a wide range of frequencies becomes a more pressing issue. The use of components such as, but not limited to, the EMI plate, the ground plate, the ground bars, the outer shell, and other components described herein are configured to significantly prevent or reduce electro-magnetic interference. For example, ground contacts may serve to reduce leakage of electromagnetic radiation from the receptacle and increase shielding of the electrical connections. The ground bar described herein is in particular a significant improvement and benefits over previous connector shielding techniques.

The shielding solutions described herein are a highly cost-effective improvement. The ground bar and ground contacts together substantially isolate the electrical contacts and communications from external influences. These components can thus be used for devices associated with high radiation or sensitivity levels, or for devices where these levels are not known in advance. In different implementations, components capable of reducing EMI can include galvanized steel, aluminum, combinations of these materials and/or other metal-based materials. In one implementation, metal-injection molded (MIM) metal parts may be utilized in connector components configured to provide EMI protection.

In addition, the utilization of PCB as a carrier of signals offers significant advantages in cost, assembly, and manufacture of the board. Rather than stamping metals, the PCB can be manufactured with the required data bars and be associated with a reduction in manual labor. The entire assembly can be encapsulated in a housing in a single overmolding process, again reducing the time needed in production. Furthermore, the integration of power bars on the same connecting plug as the data bars allows for the use of the connecting plug with previous legacy connectors, and also offers the benefit of multiple functions (2-in-1) in one structure. The use of fewer data bars to support high data transfer rates also reduces the space required for the connector in the electronic device.

In some implementations, the connector described herein is configured with a sufficient number of high speed pins to permit usage with a Surflink™ 40 pin connector. The connector can also be used for charging of legacy Surflink™ receptacles while also hosting transfer speeds of up to double the USB Type C™ and/or Thunderbolt™ 3 data rates, and in some cases, can be configured to transfer at even higher speeds. In some cases, the implementations described herein can be used to provide data transfer between electronic devices that rely on data speeds compatible with two or more USB Type-C™ ports, two or more Thunderbolt™ 3 ports, and/or two or more of a USB Type C™ port and a Thunderbolt™ 3 port.

It should be understood that a variety of other computing devices not illustrated here can be configured to connect or "mate" through the electronic connector pairing system disclosed herein, including but not limited to tablet to tablet interfaces, storage components, touchpads, drawing devices, joysticks, printers, mice, scanners, cameras, light pens, audio devices, projection devices, and other computing devices, graphical display devices, wearable device, server devices, electronic appliances, or other suitable electronic devices. Furthermore, each device can be configured to operate independently of each other. Thus, in some implementations, the electronic connectors disclosed herein may take the form of multi-function electronic connectors that may be used for a variety of electronic devices.

In some cases, the disclosed electronic connectors may replace or reduce the need for multiple independent connectors. In at least some implementations, the disclosed electronic connectors may serve as the only electronic connector located on or interfacing with an electronic device (see FIG. 1). In other cases, two or more of the disclosed electronic connectors may be present on the same device. In such configurations, the device may be configured to pass power and/or data between different connected devices.

The disclosed electronic connector can fulfill a number of functions, across a broad range of data-intensive use-scenarios, including high-speed data transfer, native video input/output, and/or electrical power. Non-limiting examples of the signaling functions that may be supported by the disclosed electronic connectors include USB 2.0, USB 3.0, USB 3.1, DisplayPort (DP), mDP, HDMI, PCIE, and THUNDERBOLT™, among other suitable functions. The disclosed electronic connectors may enable the off-loading of graphics processing to graphics processing devices or data to data storage devices (e.g., to or from a hard drive). Data transfer rates of 20 Gbps, scalable to at least 40 Gbps and potentially higher, may be achieved by the disclosed electronic connectors, while power-only modes of operation (for example, 6-A power capability) are supported across fewer connector pins (for example, 3 connector pins).

In addition, implementations of the present disclosure can make use of any of the systems, components, techniques, functions, devices, structures, elements, processes, and methods described in the "Tapered-Fang Electronic Connector" and the "Electronic Connector" applications identified above, both of these applications being herein incorporated by reference in their entirety.

While various embodiments have been described, the description is intended to be exemplary, rather than limiting, and it is understood that many more embodiments and implementations are possible that are within the scope of the embodiments. Although many possible combinations of features are shown in the accompanying figures and discussed in this detailed description, many other combinations of the disclosed features are possible. Any feature of any embodiment may be used in combination with or substituted for any other feature or element in any other embodiment unless specifically restricted. Therefore, it will be understood that any of the features shown and/or discussed in the present disclosure may be implemented together in any suitable combination. Accordingly, the embodiments are not to be restricted except in light of the attached claims and their equivalents. Also, various modifications and changes may be made within the scope of the attached claims.

While the foregoing has described what are considered to be the best mode and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

The scope of protection is limited solely by the claims that now follow. That scope is intended and should be interpreted to be as broad as is consistent with the ordinary meaning of the language that is used in the claims when interpreted in light of this specification and the prosecution history that follows and to encompass all structural and functional equivalents. Notwithstanding, none of the claims are intended to embrace subject matter that fails to satisfy the requirement of Sections 101, 102, or 103 of the Patent Act, nor should they be interpreted in such a way. Any unintended embracement of such subject matter is hereby disclaimed.

Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various examples for the purpose of streamlining the disclosure. This method of disclosure is not to be interpreted as reflecting an intention that the claims require more features than are expressly recited in each claim. Rather, as the following claims reflect, inventive subject matter lies in less than all features of a single disclosed example. Thus the following claims are hereby incorporated into the Detailed Description, with each claim standing on its own as a separately claimed subject matter.

What is claimed is:

1. An electronic connector, comprising:
a first connection face on a first side of the electronic connector and a second connection face on a second side of the electronic connector, the first side and the second side being opposite-facing sides;
a housing;
a printed circuit board enclosed at least partially within the housing;
a first group of electrical contacts arranged on the first connection face of a nose portion of the printed circuit board, the nose portion being an exposed region disposed outside of the housing; and
a first ground bar disposed on the first connection face, the first ground bar at least partially bordering the nose portion and substantially surrounding the first group of electrical contacts.

2. The electronic connector of claim 1, wherein the first ground bar is substantially U-shaped.

3. The electronic connector of claim 1, further comprising a second group of electrical contacts arranged on the second connection face of the nose portion of the printed circuit board.

4. The electronic connector of claim 1, further comprising a second ground bar disposed on the second connection face of the printed circuit board, the second ground bar at least partially bordering the exposed region of the nose portion on the second side.

5. The electronic connector of claim 1, wherein the first group of electrical contacts includes sixteen electrical contacts.

6. The electronic connector of claim 1, wherein the first side and the second side are substantially symmetrical with respect to one another.

7. The electronic connector of claim 1, further comprising a flexible connector attached to a portion of the printed circuit board.

8. The electronic connector of claim 1, wherein the housing includes an overmolded plastic.

9. The electronic connector of claim 1, wherein the first group of electrical contacts are printed onto the first connection face of the printed circuit board.

10. The electronic connector of claim 1, wherein the housing further comprises an upper portion joined to a base portion, wherein:
the upper portion includes a first flank portion, a central portion, and a second flank portion disposed opposite to the first flank portion, the central portion being disposed between the first flank portion and the second flank portion;

a continuous inner edge extends along the first flank portion, the central portion, and the second flank portion, forming a recess in the housing; and the recess is configured to receive the nose portion of the printed circuit board.

11. The electronic connector of claim 10, wherein the first ground bar is disposed adjacent to the inner edge of the housing.

12. The electronic connector of claim 10, wherein the housing further comprises a first flange and a second flange, wherein:

the first flange extends from the first flank portion in a direction toward the second flank portion;

the second flange extends from the second flank portion in a direction toward the first flank portion; and the first flange contacts a first end of the first ground bar and the second flange contacts a second end of the first ground bar.

13. The electronic connector of claim 10, further comprising a first set of power bars and a second set of power bars, wherein:

the first set of power bars are arranged on the first connection face of a first side portion of the housing;

the second set of power bars are arranged on the first connection face of a second side portion of the housing; and the first group of electrical contacts is disposed between the first set of power bars and the second set of power bars.

14. The electronic connector of claim 13, wherein a thickness of the upper portion of the housing decreases between the base and the first side portion.

15. The electronic connector of claim 13, wherein the nose portion further includes a protruding region that extends between the first flange and the second flange.

16. A connecting plug for use with an electronic connector, the connecting plug comprising:

a printed circuit board;

a first group of electrical contacts arranged on a first surface of the printed circuit board and along a front edge of the printed circuit board; and a ground bar disposed on the first surface of the printed circuit board, the ground bar at least partially bordering the front edge and substantially surrounding the first group of electrical contacts.

17. The connecting plug of claim 16, wherein the ground bar further comprises a first arm portion, a second arm portion, and a body portion, wherein the body portion extends between the first arm portion and the second arm portion and the body portion extends in a direction that is substantially perpendicular relative to the first arm portion and the second arm portion.

* * * * *